US012588471B2

(12) United States Patent
Cok et al.

(10) Patent No.: US 12,588,471 B2
(45) Date of Patent: Mar. 24, 2026

(54) MICRO-DEVICE SUBSTRATE STRUCTURES WITH POSTS AND INDENTATIONS

(71) Applicant: X Display Company Technology Limited, Dublin (IE)

(72) Inventors: Ronald S. Cok, Rochester, NY (US); Christopher Andrew Bower, Raleigh, NC (US); Matthew Alexander Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 436 days.

(21) Appl. No.: 18/098,066

(22) Filed: Jan. 17, 2023

(65) Prior Publication Data

US 2024/0242998 A1      Jul. 18, 2024

(51) Int. Cl.
| | |
|---|---|
| *H01L 21/683* | (2006.01) |
| *G03F 7/00* | (2006.01) |
| *H01L 25/00* | (2006.01) |
| *H01L 25/075* | (2006.01) |

(52) U.S. Cl.
CPC ........ H01L 21/6835 (2013.01); G03F 7/0002 (2013.01); H01L 25/0753 (2013.01); H01L 25/50 (2013.01); *H01L 2221/68368* (2013.01); *H01L 2221/68381* (2013.01)

(58) Field of Classification Search
CPC ................ H01L 25/0753; H01L 25/50; H01L 2221/68354; H01L 21/6836; H01L 2221/68327; H01L 21/6835; H01L 2221/68318; H01L 2221/6834; H01L 2221/68381

USPC ........ 257/774; 438/629, 637, 639, 640, 667, 438/668, 672, 675, 700, 701, 713, 978
See application file for complete search history.

(56) References Cited

U.S. PATENT DOCUMENTS

| | | | |
|---|---|---|---|
| 6,825,559 | B2 | 11/2004 | Mishra et al. |
| 7,622,367 | B1 | 11/2009 | Nuzzo et al. |
| 8,506,867 | B2 | 8/2013 | Menard |
| 8,722,458 | B2 | 5/2014 | Rogers et al. |
| 8,889,485 | B2 | 11/2014 | Bower |
| 9,520,537 | B2 | 12/2016 | Bower et al. |
| 10,468,363 | B2 | 11/2019 | Prevatte et al. |
| 11,495,560 | B2 | 11/2022 | Prevatte et al. |
| 2014/0353791 | A1* | 12/2014 | Jain ..................... A61B 5/6846 257/434 |

(Continued)

OTHER PUBLICATIONS

Cok, R. S. et. al., AMOLED displays with transfer-printed integrated circuits, Journal of SID, 19(4):335-341, (2011).

*Primary Examiner* — Didarul A Mazumder
(74) *Attorney, Agent, or Firm* — Schwegman Lundberg & Woessner, P.A.

(57) ABSTRACT

A micro-device substrate structure includes a support substrate having a support-substrate surface, spatially separated indentations extending into the support substrate, and a micro-device comprising a micro-device body and micro-device posts. The micro-device posts extend from the micro-device body into the support substrate and each of the posts is disposed at least partly in a different indentation. A release layer can be disposed between the micro-device posts and the support substrate. When the release layer is etched, the micro-device can be completely disconnected from the source substrate, removed from the indentations and source substrate, and micro-transfer printed to a target substrate.

22 Claims, 18 Drawing Sheets

(56)        References Cited

U.S. PATENT DOCUMENTS

| | | | |
|---|---|---|---|
| 2016/0093600 A1 | 3/2016 | Bower et al. | |
| 2017/0048976 A1* | 2/2017 | Prevatte | H01L 24/95 |
| 2017/0338542 A1* | 11/2017 | Cok | H01Q 1/2225 |
| 2019/0157532 A1* | 5/2019 | Meitl | H10H 20/01 |
| 2019/0267363 A1* | 8/2019 | Bower | G02B 27/0101 |
| 2020/0214141 A1* | 7/2020 | Bower | H01L 24/25 |
| 2020/0395510 A1* | 12/2020 | Bower | H10H 29/142 |
| 2021/0343903 A1 | 11/2021 | Bower et al. | |
| 2021/0375979 A1* | 12/2021 | Cok | H10H 29/10 |
| 2022/0069154 A1* | 3/2022 | Bower | H10F 77/413 |

* cited by examiner

MICRO-DEVICE SUBSTRATE STRUCTURES WITH POSTS AND INDENTATIONS

FIELD

The present disclosure relates generally to structures and methods for providing micro-integrated circuits on substrates that can be printed to target substrates and electrically connected to contact pads using massively parallel transfer printing methods (e.g., micro-transfer printing methods).

BACKGROUND

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit. An unpackaged integrated circuit is often referred to as a die. Each die typically has electrical contact pads on the top of the integrated circuit that are electrically connected to electronic circuits in the integrated circuit. The die is placed in a cavity in the package, the electrical contact pads are wire-bonded and electrically connected to the package pins or bumps, and the package is sealed. Frequently, multiple identical devices are formed in the semiconductor wafer and the wafer is cut (for example by scribing-and-breaking or by sawing the wafer) into separate integrated circuit dies that are each individually packaged. The packages are then mounted and electrically connected on a printed-circuit board to make an electronic system.

In an alternative flip-chip approach, small spheres of solder (solder bumps) are deposited on the integrated-circuit contact pads and the integrated circuit is flipped over so that the top side of the die with the solder bumps is located adjacent to the package or other destination substrate. This approach is particularly useful for packages such as pin-grid array packages because they can require less space than a wire-bond process. However, flipping the integrated circuit over can be difficult for very small integrated circuits having dimensions in the range of microns. Such small integrated circuit dies are not easily handled without loss or damage using conventional pick-and-place or vacuum tools.

In some applications, the bare integrated-circuit dies are not separately packaged but are placed on a destination substrate and electrically connected on the destination substrate, for example using photolithographic or printed-circuit board methods, to form an electronic system. However, as with flip-chip handling, this can be difficult to accomplish when the integrated-circuit dies are small. Nonetheless, an efficient method of transferring bare dies from a relatively small and expensive source substrate (e.g., crystalline semiconductor) to a relatively large and inexpensive destination substrate (e.g., amorphous glass or plastic) is very desirable, since the integrated circuits can provide much higher data processing efficiency than thin-film semiconductor structures formed on large substrates.

One approach to handling and placing small integrated circuits (chiplets) uses micro-transfer printing, for example as described in U.S. Pat. Nos. 8,722,458, 7,622,367 and 8,506,867, each of which is hereby incorporated by reference in its entirety. In exemplary embodiments of these methods, an integrated circuit is formed on a source wafer, for example a semiconductor wafer, and undercut by etching a gap between a bottom side of the integrated circuit and the wafer. A stamp contacts a top side of the integrated circuit to adhere the integrated circuit to the stamp, the stamp and integrated circuit are transported to a destination substrate, for example a glass or plastic substrate, the integrated circuit is contacted and adhered to the destination substrate, and the stamp removed to "print" the integrated circuit from the source wafer to the destination substrate. Multiple integrated circuits can be "printed" in a common step with a single stamp. The integrated circuits can then be electrically connected using conventional photolithographic or printed-circuit board methods, or both. This technique has the advantage of locating many (e.g., tens or hundreds of thousands of) small integrated-circuit devices on a destination substrate in a single print step. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

In another method, a handle substrate is adhered to the side of the integrated circuits opposite the wafer (the top side), the wafer is removed, for example by grinding, the integrated circuits are adhered to the destination substrate, and the handle substrate is removed. In yet another variation, the handle substrate is the destination substrate and is not removed. In this case, the integrated circuit is flipped over so that the top side of the integrated circuit is adhered to the destination substrate.

In yet another method, epitaxial semiconductor layers are formed on a growth substrate, for example a sapphire substrate. A handle substrate is adhered to the top side of the semiconductor layers opposite the growth substrate, and the growth substrate is removed. The flipped semiconductor layers are then processed to form the integrated circuits. For example, U.S. Pat. No. 6,825,559 describes such a method to make light emitting diodes.

None of these flip-chip methods form a flipped integrated circuit that can be micro-transfer printed. Moreover, GaN micro-LEDs are typically formed on sapphire substrates since sapphire has a smaller crystal lattice mismatch with GaN than other materials, such as silicon. Thus, it is desirable to form printable integrated circuit structures, such as micro-LEDs, using a sapphire substrate. However, there is no known available method in the art for reliably under-cutting a chiplet formed on a sapphire substrate to enable release of the chiplet without damaging the chiplet (e.g., for micro-transfer printing).

There is a need, therefore, for wafer and integrated-circuit structures and methods that provide micro-transfer printable integrated circuits and for structures and methods that enable the construction of micro-LED chiplets formed on various substrates, including sapphire, that can be micro-transfer printed with desirable accuracy. There is also a need for simple and inexpensive methods and structures having a reduced area on a source wafer and for simple, reliable, and inexpensive methods and structures for electrically connecting integrated circuits with electrical contact pads on a destination substrate.

SUMMARY

According to embodiments of the present disclosure, inter alia, a micro-substrate structure comprises a support substrate having a support-substrate surface, spatially separated indentations (e.g., notches, wells, or depressions) extending into the support substrate, and a micro-device comprising a micro-device body and micro-device posts. The micro-device posts extend from the micro-device body into the support substrate and each of the posts is disposed at least partly in a different indentation. The posts can have a distal end having a distal area smaller than an area of a proximal end attached to the micro-device body. In some embodiments, the posts are sharp and can pierce an electrical contact pad on a target substrate. The posts can be electrically conductive and can be connection posts that electrically connect to a micro-device circuit formed in or on (e.g., native to) the micro-device body. In some embodiments, the micro-devices comprise three or more posts, the spatially separated indentations comprise three or more indentations, the posts are arranged in two dimensions, and the indentations are arranged in two dimensions, for example in a two by two or three by three arrangement.

In some embodiments, the support substrate comprises a cavity (e.g., a recess or pocket) extending into the support substrate from the support-substrate surface to a cavity bottom of the cavity and the spatially separated indentations are disposed in the cavity bottom and extend into the support substrate. The cavities can be larger than the indentations, e.g., have a greater volume. The indentations can extend from the cavity, e.g., from the cavity bottom into the support substrate. In some embodiments, the micro-device is disposed at least partially or entirely in the cavity. The cavity bottom can have a bottom planar area over the support substrate that is substantially planar, the indentations together can have an indentation area over the support substrate, and the indentation area can be less than the bottom planar area. The indentation area can be no greater than one half, one fifth, one quarter, one third, or one half of the bottom planar area.

In some embodiments, the posts are not attached to the indentations or to the support substrate. The posts can have a shape geometrically similar to the indentation. In some embodiments, the posts have a shape that is not geometrically similar to the indentation. The indentations can have a volume that is greater than the posts. The posts can extend from the micro-device body a distance greater than a depth of the indentation.

A release layer can be disposed between the support substrate and the micro-device. In some embodiments, at least a portion of the release layer is exposed. The release layer can be differentially etchable from the micro-device (e.g., the micro-device body or the micro-device posts. The micro-device body can be spaced apart from the support substrate by a gap, for example formed by etching the release layer. In some embodiments, no portion of the micro-device is in direct contact with the support substrate. In some embodiments, the micro-device has one or more sides (e.g., edges) that are adjacent to the support substrate and the release layer is disposed between all of the one or more sides of the micro-device and the support substrate.

Embodiments of the present disclosure can comprise a carrier substrate and the support substrate can be a bonding layer that bonds the micro-device to the carrier substrate. The support substrate can be a semiconductor wafer. In some embodiments, the micro-device is non-native to the support substrate, e.g., is not formed or constructed on the support substrate but is disposed on the support substrate using assembly methods such as micro-transfer printing. In some embodiments, the micro-device is native to the support substrate, e.g., is formed or constructed on the support substrate.

In some embodiments, a surface of the micro-device opposite the support substrate is exposed.

According to embodiments of the present disclosure, a method of making a micro-device substrate structure comprises providing a source substrate, forming a micro-device comprising a micro-device body and posts extending from the micro-device body, providing a release layer completely over the micro-device, coating (e.g., spin, spray or curtain coating) a bonding layer over the release layer, adhering a carrier substrate to the bonding layer, removing the source substrate, and etching the release layer to completely release the micro-device from the bonding layer. Some embodiments comprise providing a stamp, contacting the stamp to the micro-device on a side of the micro-device opposite the carrier substrate, and removing the micro-device from the carrier substrate and the bonding layer with the stamp. Removing the source substrate can exposes a side of the micro-device and at least a portion of the release layer.

According to embodiments of the present disclosure, a method of making a micro-device substrate structure comprises providing a source substrate, forming indentations in the source substrate, forming a release layer over the source substrate, the release layer only partially filling the indentations, forming a post in each of the indentations extending into the source substrate, forming a micro-device body over and physically connected to the posts, the posts and micro-device defining a micro-device, removing the release layer so that the micro-device is disconnected from the source substrate, and etching the release layer to completely release the micro-device from the bonding layer. Some embodiments comprise providing a stamp, contacting the stamp to the micro-device on a side of the micro-device opposite the source substrate, and removing the micro-device from the source substrate with the stamp.

Embodiments of the present disclosure provide wafer and integrated-circuit structures and methods that provide micro-transfer printable integrated circuits and electrical interconnections to the integrated-circuit structures with improved spatial accuracy that can be made with micro-transfer printing.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1A:
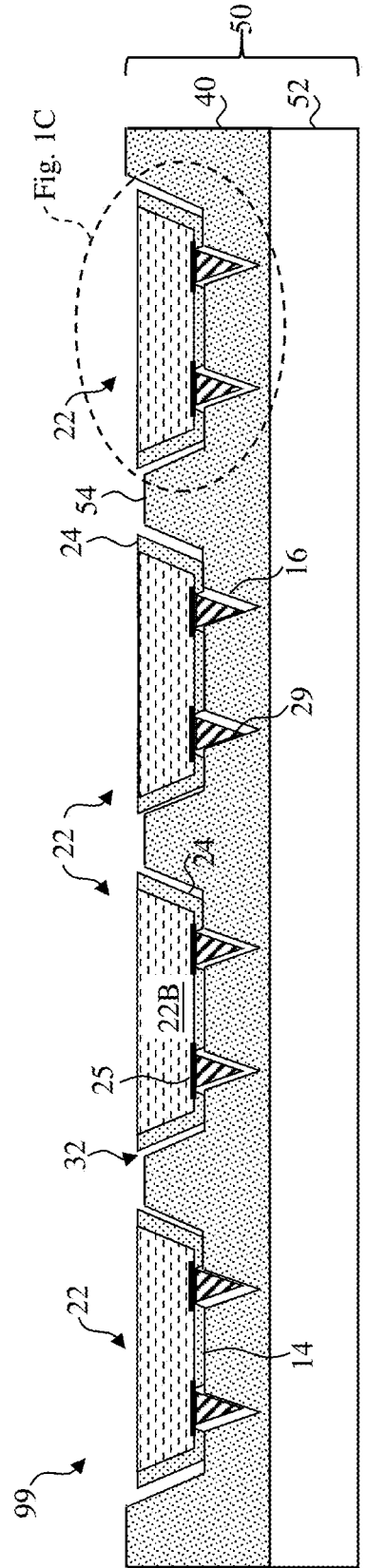
FIG. 1A is a cross section of a micro-device substrate structure including a cavity according to illustrative embodiments of the present disclosure.
Figure 1A:

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale.

DETAILED DESCRIPTION OF CERTAIN EMBODIMENTS

The present disclosure provides, inter alia, structures and methods for making transfer printable (e.g., micro-transfer printable) micro-devices on a source substrate and for transfer printing to and electrically connecting the micro-devices on a target (e.g., destination) substrate with improved alignment and manufacturability and reduced costs. Micro-transfer printable micro-devices of the present disclosure can be, for example, a variety of semiconductor structures, including a diode, a light-emitting diode (LED), a laser, a photo-diode, a photo-transistor, a transistor, a power transistor, a high-electron-mobility transistor, or an integrated circuit.

The present disclosure also provides, inter alia, structures and methods to enable micro-transfer printing of flipped integrated circuits adhered to a handle substrate. By forming completed semiconductor micro-devices before the removal of a support or growth substrate, photolithographic processing steps that would otherwise disable or destroy release layers and structures needed or desired for micro-transfer printing are performed before the construction of the release layer. Thus, in some embodiments, once a source or growth substrate is removed, a release layer can be etched and completed semiconductor micro-devices transfer printed (e.g., micro-transfer printed) without exposing the completed semiconductor micro-device or release layer to destructive photolithographic process steps. Completed semiconductor micro-devices are otherwise functional devices that do not necessarily, but can, include electrical conductors necessary for providing electrical power to the completed semiconductor devices, such as, for example, light-emitting diodes (LEDs) or integrated circuits.

Figure 1B:
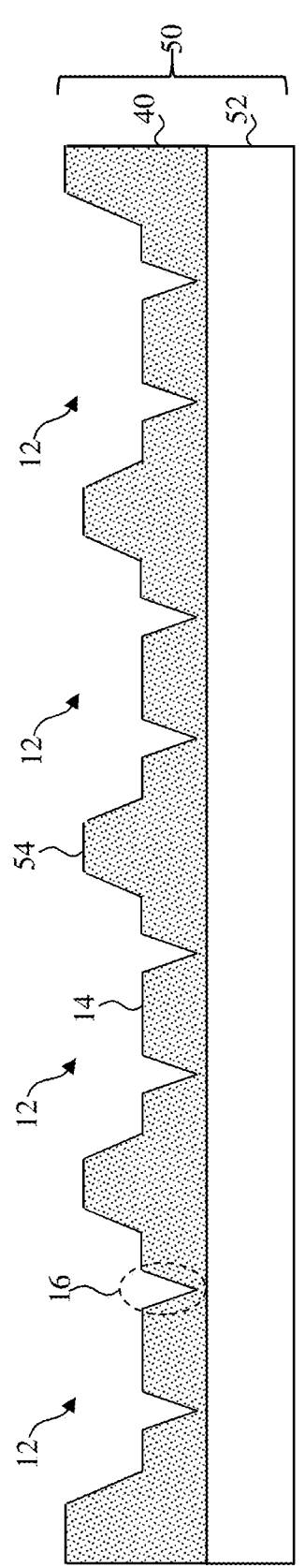
FIG. 1B is a cross section of a portion of FIG. 1A excluding the micro-device according to illustrative embodiments of the present disclosure.
Figure 1C:
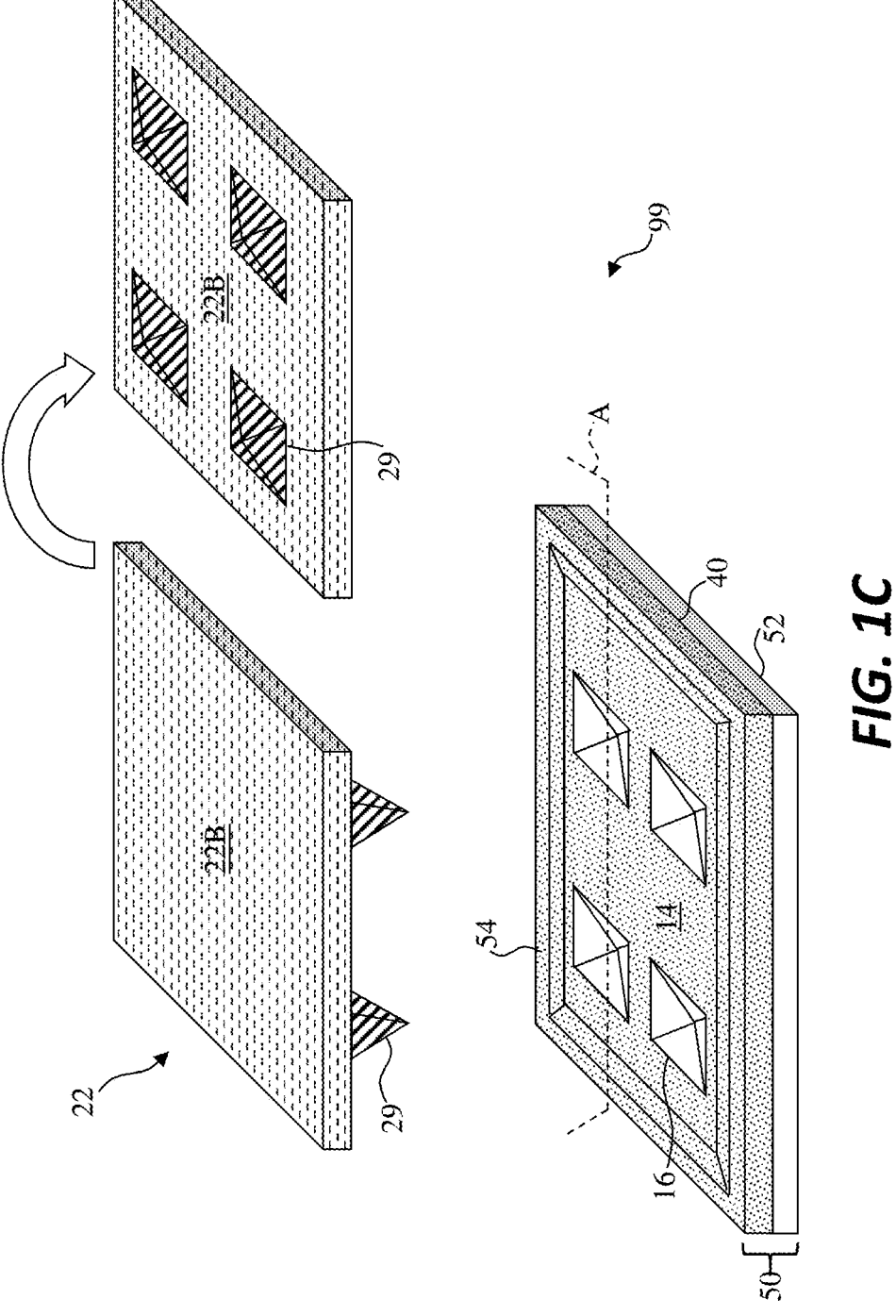
FIG. 1C is an exploded perspective and inverted view of a portion of FIG. 1A according to illustrative embodiments of the present disclosure.

FIGS. 1A-1C illustrate embodiments of the present disclosure. As shown in FIGS. 1A-1C, a micro-device substrate structure 99 comprises a support substrate 50 having a support-substrate surface 54. Support substrate 50 can comprise a single unitary substrate, a substrate comprising multiple layers as shown, or a layer disposed on other layers. Support substrate 50 can be substantially transparent, for example 50%, 70%, or 90% transparent to visible, UV, or IR electromagnetic radiation or to laser radiation. FIGS. 1A-1C illustrate support substrate 50 comprising a bonding layer 40 disposed on a carrier substrate 52. A cavity 12 (e.g., a recess or pocket) can, but does not necessarily, extend into support substrate 50 (e.g., into a layer of support substrate 50 such as bonding layer 40) from support-substrate surface 54 to a cavity bottom 14 of cavity 12. Support-substrate surface 54 or cavity bottom 14 comprises spatially separated indentations 16 (e.g., notches, wells, holes, or depressions) in support-substrate surface 54 or cavity bottom 14 extending into support substrate 50 (e.g., into a layer of support substrate 50 such as bonding layer 40). A micro-device 22 can be disposed on, over, or in support substrate 50 and can be at least partially in cavity 12, if cavity 12 is present. Micro-device 22 can comprise a micro-device body 22B and micro-device posts 29 extending from micro-device body 22B into support substrate 50. Each post 29 is disposed at least partly in a different (e.g., separate, independent) indentation 16.

According to embodiments of the present disclosure, support substrate 50 can be a cured resin layer such as a photoresist, a cured adhesive layer such as a cured epoxy, or a carrier substrate 52 such as a glass, polymer, or semiconductor (e.g., silicon) wafer or substrate. In some embodiments, support substrate 50 is a carrier substrate 52 with a bonding layer 40 disposed thereon and adjacent to micro-device 22. In some embodiments, support substrate 50 can be a semiconductor wafer or semiconductor substrate. Bonding layer 40, if present, can be a cured adhesive, resin, or epoxy or a photoresist layer cured, for example, by providing time, heat, cooling, or electromagnetic radiation to bonding layer 40, for example through carrier substrate 52. Cavity 12 or indentations 16 can be formed in support substrate 50 by pattern-wise etching, e.g., by etching through a patterned mask or by disposing a layer (e.g., bonding layer 40) on or over a constructed micro-device 22 and taking the shape of a side of micro-device 22. Micro-device 22 can be any useful structure, for example a semiconductor device or integrated circuit. Micro-device body 22B can comprise a semiconductor or epitaxial layer or material or a glass or polymer material. Micro-device posts 29 can comprise an electrically conductive material, e.g., a metal or combination of metals or metal alloy. Micro-device posts 29 can be solid. Micro-device posts 29 can be unitary. Micro-device posts 29 can comprise layers, for example a dielectric core coated with an electrical conductor such as a metal.

Figure 2:
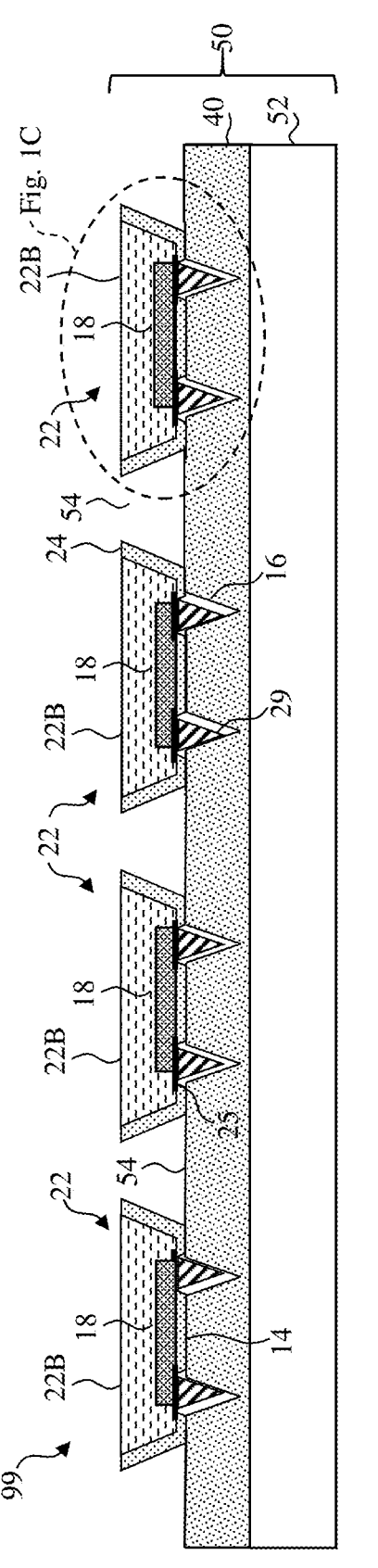
FIG. 2 is a cross section of a micro-device substrate structure without a cavity according to illustrative embodiments of the present disclosure.

FIGS. 1A and 2 show an integrated circuit with a dielectric layer 24 coating a semiconductor structure comprising an electronic or photonic micro-device circuit 18 to insulate electronic or photonic circuit 18 except for electrical contacts 25 electrically connected to electronic or photonic circuit 18. Electrically conductive posts 29 (e.g., connection posts 29) can be electrically connected through electrical contacts 25 to electronic or photonic circuit 18. In FIGS. 1A-1C, micro-devices 22 are each disposed in a separate cavity 12 in support substrate 50 (e.g., in boding layer 40).

FIG. 1A illustrates a cross section of micro-devices 22 in cavities 12 with posts 29 in indentations 16. For clarity, FIG. 1B illustrates the structure of support substrate 50 and indentations 16 without micro-devices 22 present. FIG. 1C is an exploded perspective of micro-devices 22 above support substrate 50 and with micro-devices 22 flipped over with respect to support substrate 50 to show posts 29. FIG. 2 is a cross section of micro-device substrate structure 99 corresponding to FIG. 1A with a support substrate 50 that does not comprise a cavity 12. In FIG. 2, micro-devices 22 with posts 29 extending into indentations 16 are disposed on support-substrate surface 54 but not in a cavity 12 in support substrate 50.

In embodiments in which support substrate 50 comprises a cavity 12 (e.g., a recess or pocket) extending into support substrate 50 from support-substrate surface 54 to a cavity bottom 14 of cavity 12 and spatially separated indentations 16 (e.g., notches or wells) are disposed in cavity bottom 14 and extend into support substrate 50 (as in FIGS. 1A-1C), cavity bottom 14 having a bottom area over support substrate 50 can be substantially planar, indentations 16 together can have an indentation area over support substrate 50, and the indentation area can be less than the bottom area (e.g., the indentation area is no greater than one half, one fifth, one quarter, one third, or one half of the bottom area). In some embodiments, posts 29 have a shape geometrically similar to indentation 16, e.g., a substantially same shape that has a same or a different size, for example within the limits of a manufacturing process.

Figure 3:
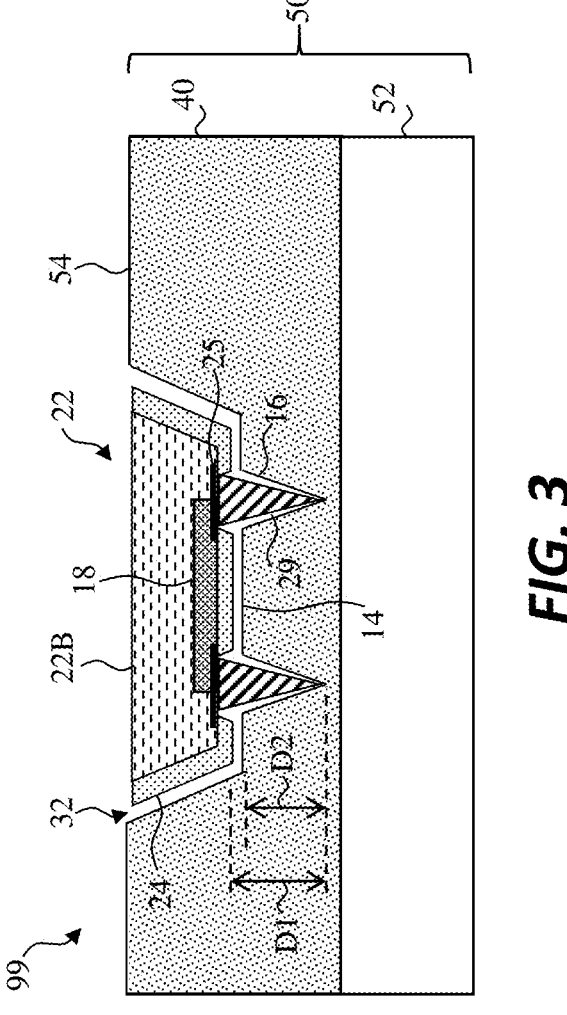
FIG. 3 is a cross section of a micro-device substrate structure having posts that are longer than a depth of indentations according to illustrative embodiments of the present disclosure.

In embodiments of the present disclosure, posts 29 are not attached to indentations 16 or to support substrate 50, for example is not attached with a chemical bond or with a physical structure. Similarly, in embodiments, micro-devices 22 are not attached to indentations 16 or to support substrate 50. In some embodiments, posts 29 are in contact (e.g., in direct physical contact) with an edge of indentations 16, micro-devices 22 are in contact (e.g., in direct physical contact) with a surface of support substrate 50, e.g., support-substrate surface 54 or cavity bottom 14, or both. When in physical contact, micro-devices 22 or posts 29 can experience stiction that provides a force attracting micro-devices 22 to support substrate 50. As used herein, stiction is not a chemical bond or force. As shown in FIGS. 1A-2, posts 29 have a volume (e.g., a size) approximately equal to or slightly smaller than a volume of indentations 16. Thus, surfaces of micro-devices 22 in cavity 12 on cavity bottom 14 or on support-substrate surface 54 can contact cavity bottom 14, indentations 16, or support-substrate surface 54. In some embodiments and as shown in FIG. 3, posts 29 have a volume (e.g., size) that is greater than a volume of indentations 16. In particular, posts 29 can have a length from micro-device body 22B that is greater than a depth of indentations 16 so that posts 29 extend from micro-device body 22B a distance D1 greater than a depth D2 of indentation 16 and micro-device body 22B can be spaced apart from support substrate 50 (e.g., cavity bottom 14) by a gap 32. Essentially, as shown in FIG. 3, posts 29 serve as a stand-off for micro-device body 22B forming gap 32 between micro-device 22 and support substrate 50 and preventing at least some or all physical contact between micro-devices 22 and support substrates 50. Furthermore, as shown in FIG. 3 for example, indentations 16 can have a shape that is not geometrically similar to a shape of posts 29, reducing any area of contact between posts 29 and indentations 16, particularly where posts 29 have a sharp distal end farther from micro-device body 22B with an area much smaller than a proximal end in contact with micro-device body 22B. Posts 29 can contact sides of indentations 16 but the area of contact between posts 29 and sides of indentations 16 can be smaller (e.g., as shown in FIG. 3) than an area of contact between micro-device bodies 22B and support substrate 50 (e.g., as shown in FIGS. 1A, 1C, and 2). Thus, micro-devices 22 can be removed more readily and with less force from support substrate 50.

According to embodiments of the present disclosure, micro-devices 22 on support substrate 50 are removed from support substrate 50 by micro-transfer printing. To facilitate micro-transfer printing micro-devices 22 from support substrate 50, it is helpful to reduce contact area between micro-devices 22 and support substrate 50, even where there is no chemical adhesion or physical structure between micro-devices 22 and support substrate 50. Thus, structures of the present disclosure reduce physical contact area between micro-devices 22 and support substrate 50, thereby reducing stiction between micro-devices 22 and support substrate 50 and facilitating the removal of micro-devices 22 from support substrate 50 by micro-transfer printing.

Embodiments of the present disclosure can also enable micro-transfer printing micro-devices 22 from support substrate 50 without using physical structures, such as tethers (e.g., lateral tethers), connecting micro-devices 22 to support substrate 50. This can reduce the distance necessary between micro-devices 22 on support substrate 50, increasing the number of micro-devices 22 that can be formed or disposed on a support substrate 50, reducing costs. For example, micro-devices 22 first formed on a semiconductor source substrate (e.g., a semiconductor source wafer) provides more micro-devices 22 on each semiconductor substrate and reduces the cost of each individual micro-device 22.

Accurate micro-device 22 positioning on a destination (target) substrate using micro-transfer printing requires correspondingly accurate micro-device 22 positioning on support substrate 50 from which micro-device 22 is picked up. Precise micro-device 22 positioning in the absence of a physical structure locating micro-devices 22 on support substrate 50 can be enabled using multiple micro-device posts 29 disposed within corresponding spatially separated indentations 16. According to embodiments of the present disclosure, multiple posts 29 in indentations 16 mechanically prevent substantial movement of micro-devices 22 with respect to support substrate 50. The space in gaps 32 between posts 29 and edges of indentations 16 is limited and, especially when multiple posts 29 are each disposed in a corresponding separated indentation 16, can physically limit micro-device 22 movement (e.g., micro-device 22 translation or rotation with respect to support substrate 50) by limiting the space between posts 29 and indentations 16. In some embodiments, posts 29 having a sharp point and a length greater than a depth of indentations 16 can be located at the bottom of indentations 16, reducing micro-device 22 area in contact with support substrate 50 (e.g., a contact area that is only the point of posts 29 in contact with the point of indentations 16) similarly restricting movement of micro-devices 22 with respect to support substrate 50 as well as reducing stiction between micro-devices 22 and support substrate 50. Since post 29 and indentation 16 structures can be constructed using photolithography having very fine resolution features, micro-device 22 can be located in precise alignment with respect to support substrate 50 even in the absence of physical structures such as tethers connecting micro-devices 22 to support substrate 50, thereby enabling similarly precise micro-device 22 pick-up by a micro-transfer printing stamp 80 and printing to a destination (target) substrate 90 (as discussed below). To further align micro-devices 22 to support substrate 50, micro-devices 22 can comprise three or more posts 29, the spatially separated indentations 16 can comprise three or more indentations 16, posts 29 can be arranged in two dimensions, and indentations 16 can be arranged in two dimensions. Precise micro-device 22 positioning on a target (destination) substrate 90 can enable accurate electrical or optical connections between micro-device 22 and structures (e.g., wires or light guides) on target substrate 90.

According to some embodiments of the present disclosure, micro-device substrate structures 99 can be constructed by forming micro-devices 22 on a source substrate 10 so that micro-devices 22 are native to source substrate 10, coating micro-devices 22 with a release layer 30, adhering release layer 30 to a carrier substrate 52 with a bonding layer 40 forming support substrate 50 (and so that micro-devices 22 are non-native to support substrate 50), removing source substrate 10 and exposing a surface of micro-device 22 and at least a portion of release layer 30, and etching release layer 30 to release and completely detach micro-device 22 from support substrate 50. In some embodiments, micro-device substrate structures 99 can be constructed by forming micro-devices 22 over a release layer 30 on a source substrate 10 that is also a support substrate 50 so that micro-devices 22 are native to support substrate 50 and etching release layer 30 to release and completely detach micro-device 22 from support substrate 50.

Once micro-devices 22 are detached from support substrate 50, micro-devices 22 can be micro-transfer printed from support substrate 50 to a target (destination) substrate 90. To facilitate completely detaching micro-device 22 from support substrate 50, release layer 30 can be disposed completely between support substrate 50 and micro-device 22 so that no portion of micro-device 22 is in physical contact with support substrate 50. For example, micro-device 22 can have one or more sides (e.g., edges) that are adjacent to support substrate 50 and release layer 30 can be disposed between all of the one or more adjacent sides of micro-device 22 and support substrate 50. In some embodiments, release layer 30 is disposed between support substrate 50 and micro-device 22 (e.g., with or without bonding layer 40) and around a perimeter of micro-device (e.g., as shown in FIGS. 4E-4F). Release layer 30 can be differentially etchable from micro-device 22 (e.g., differentially etchable from micro-device body 22B and differentially etchable from micro-device posts 29). To enable etching release layer 30, at least a portion of release layer 30 can be exposed to a local environment so that a provided etchant can etch the exposed portion of release layer 30 and then proceed to etch the entire release layer 30. When release layer 30 is exposed to local environment, etchant can flow from the local environment to directly contact release layer 30 to etch it.

Figures 4A, 4B:
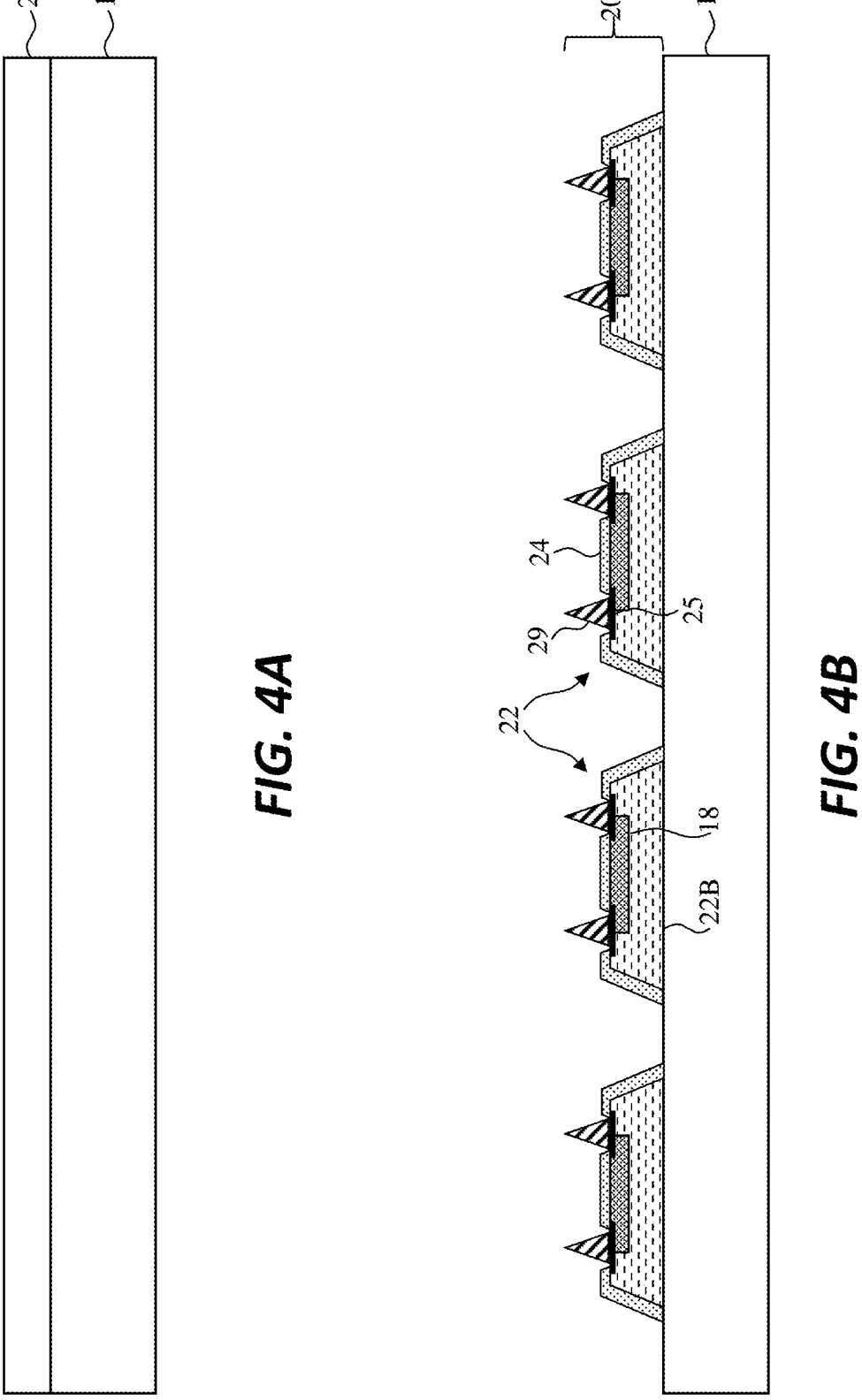
FIGS. 4A-4K are successive cross sections illustrating sequential steps in exemplary methods according to illustrative embodiments of the present disclosure and illustrating micro-device substrate structures according to illustrative embodiments of the present disclosure.
Figures 4C, 4D:
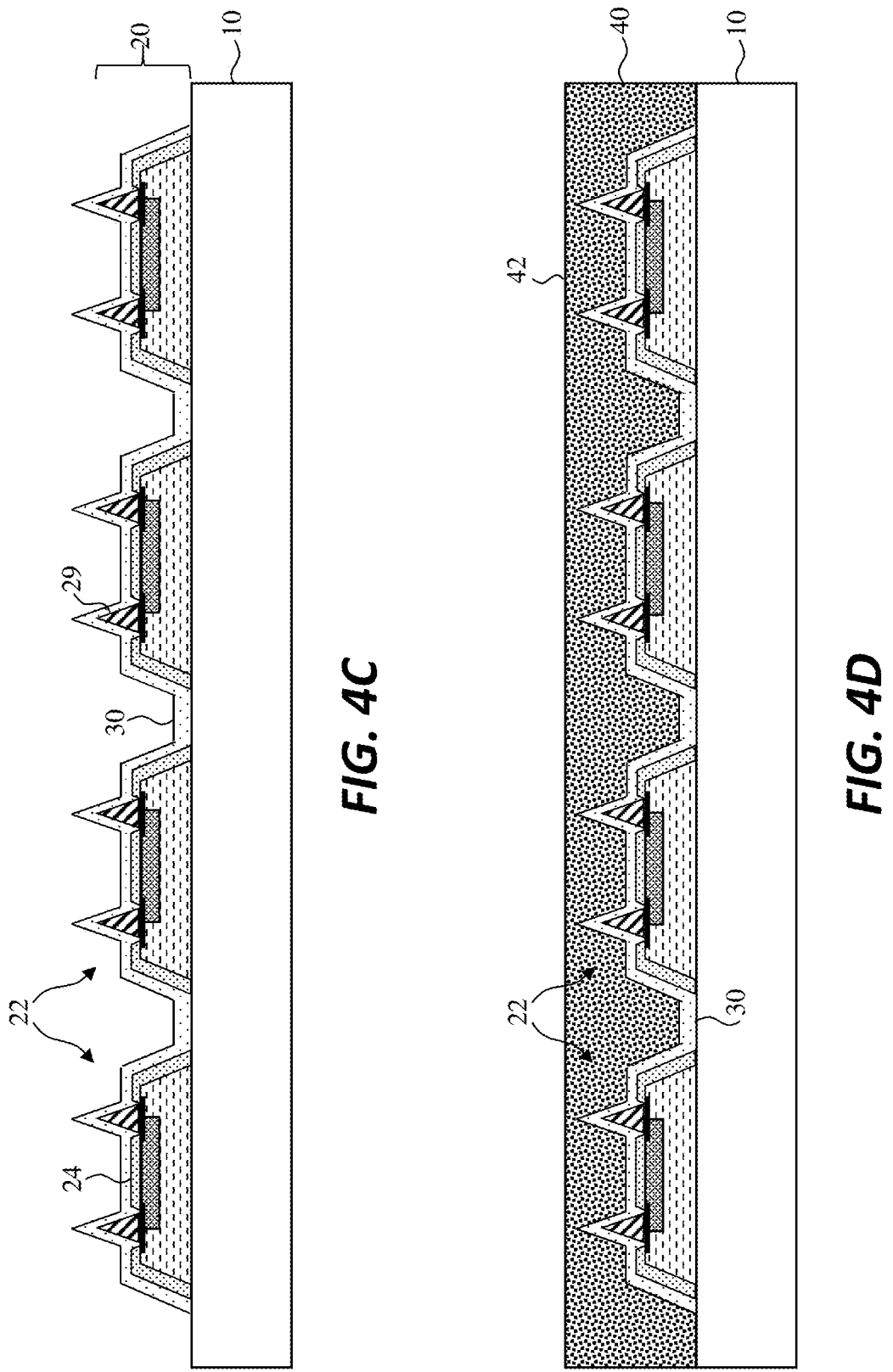
Figures 4E, 4F:
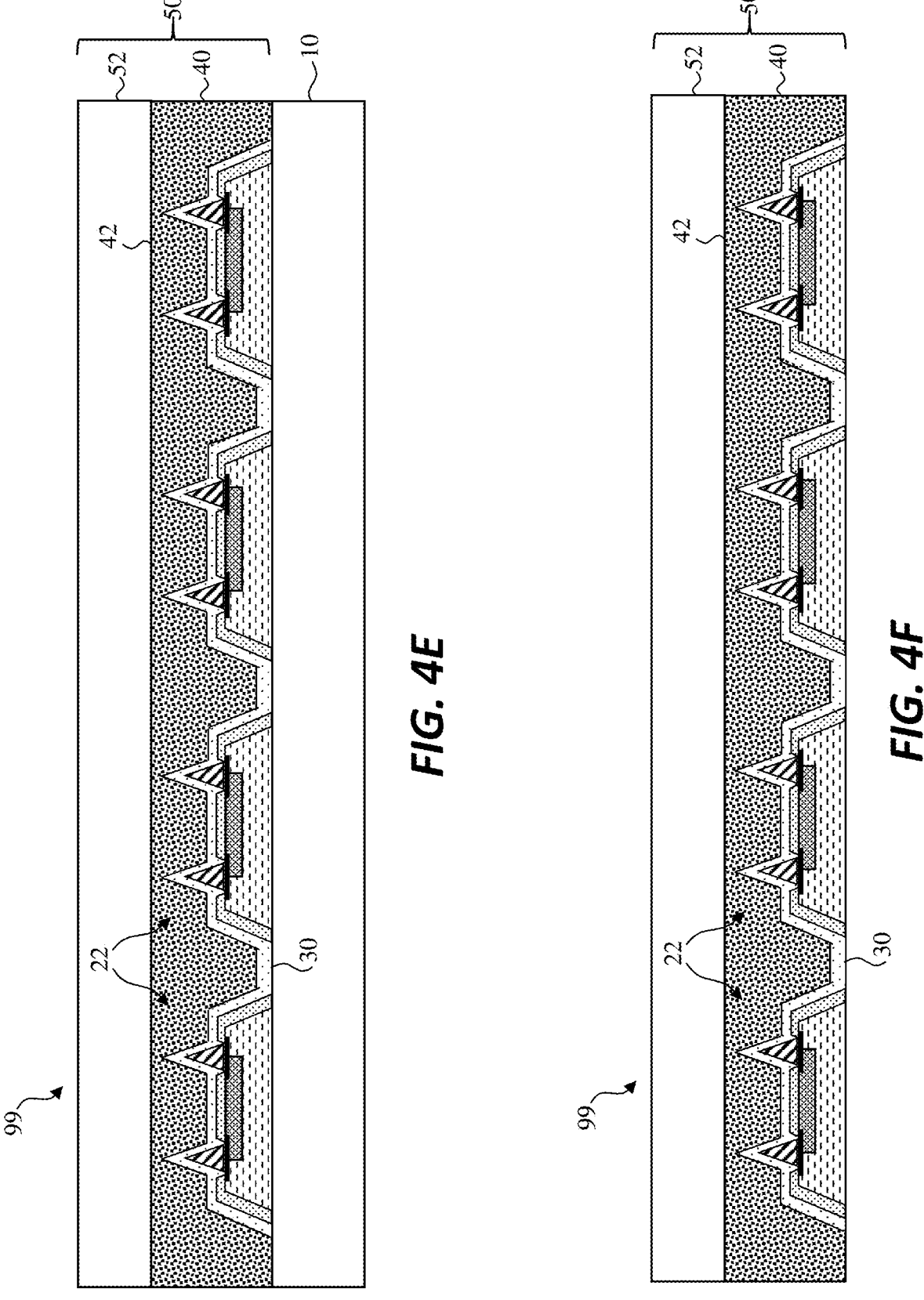
Figure 4G:
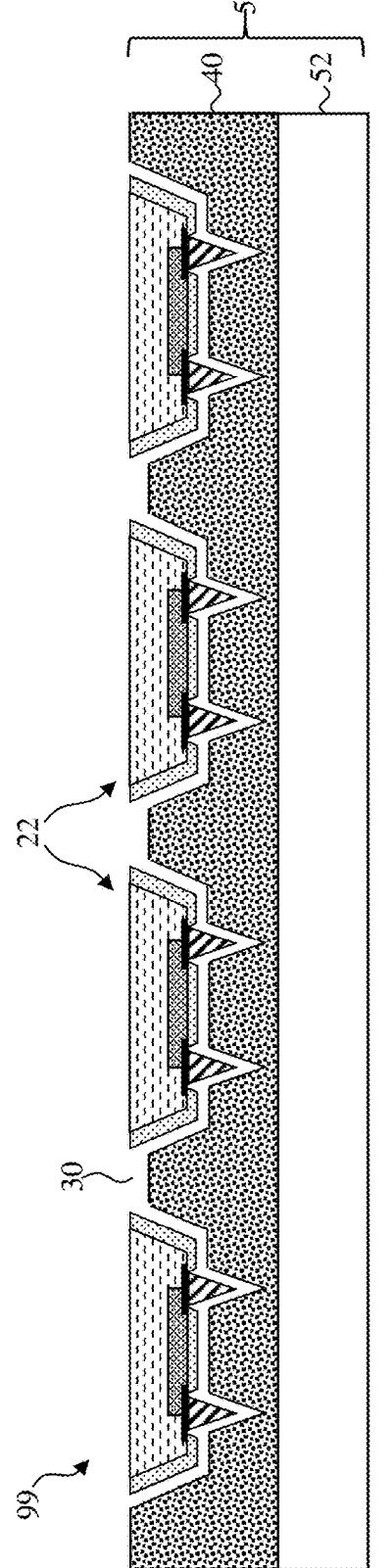
Figure 4H:
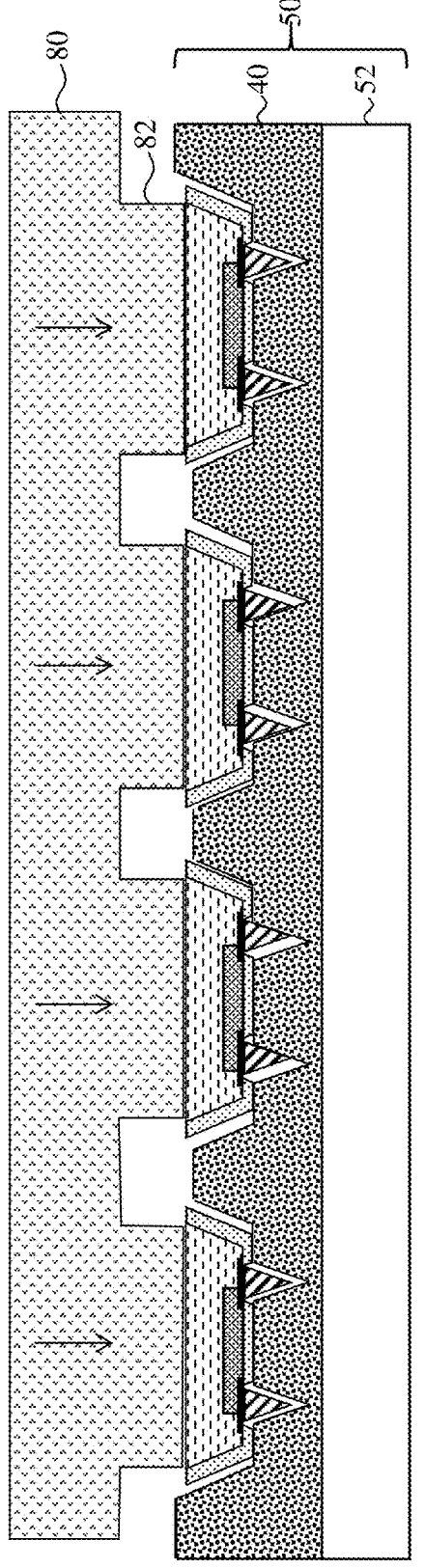
Figure 4I:
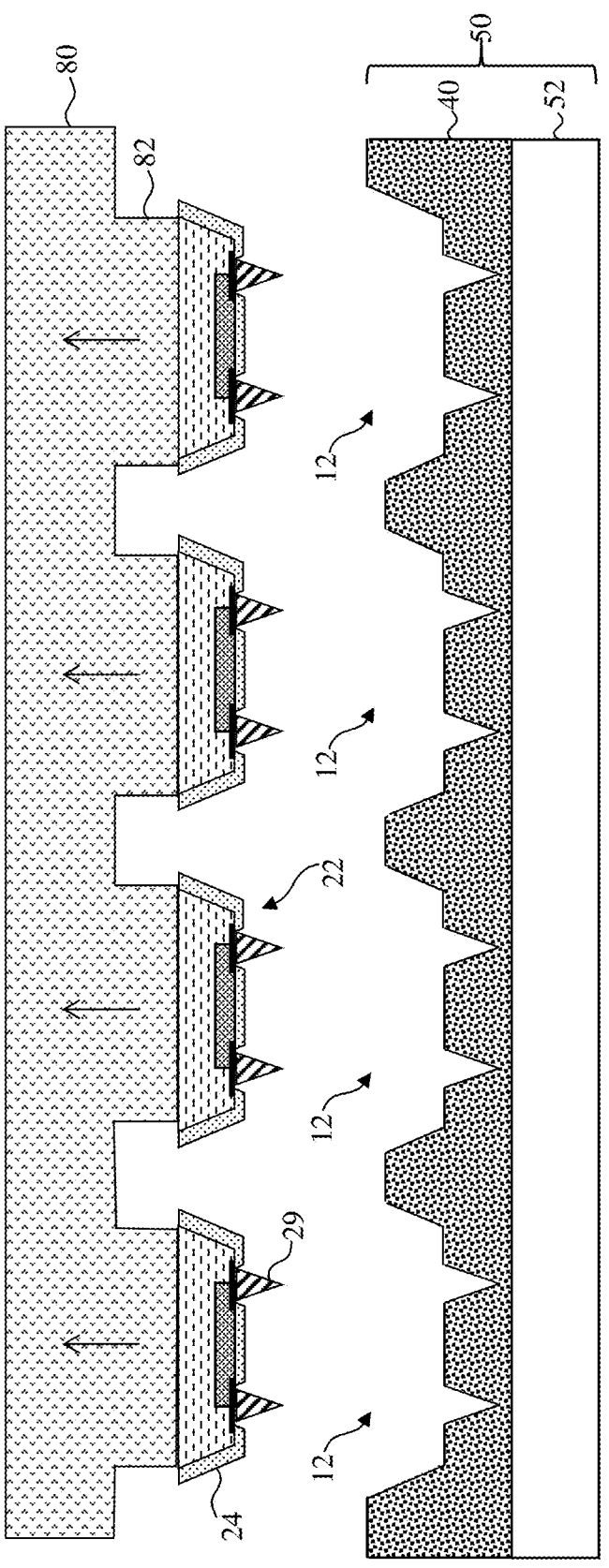
Figures 4J, 4K:
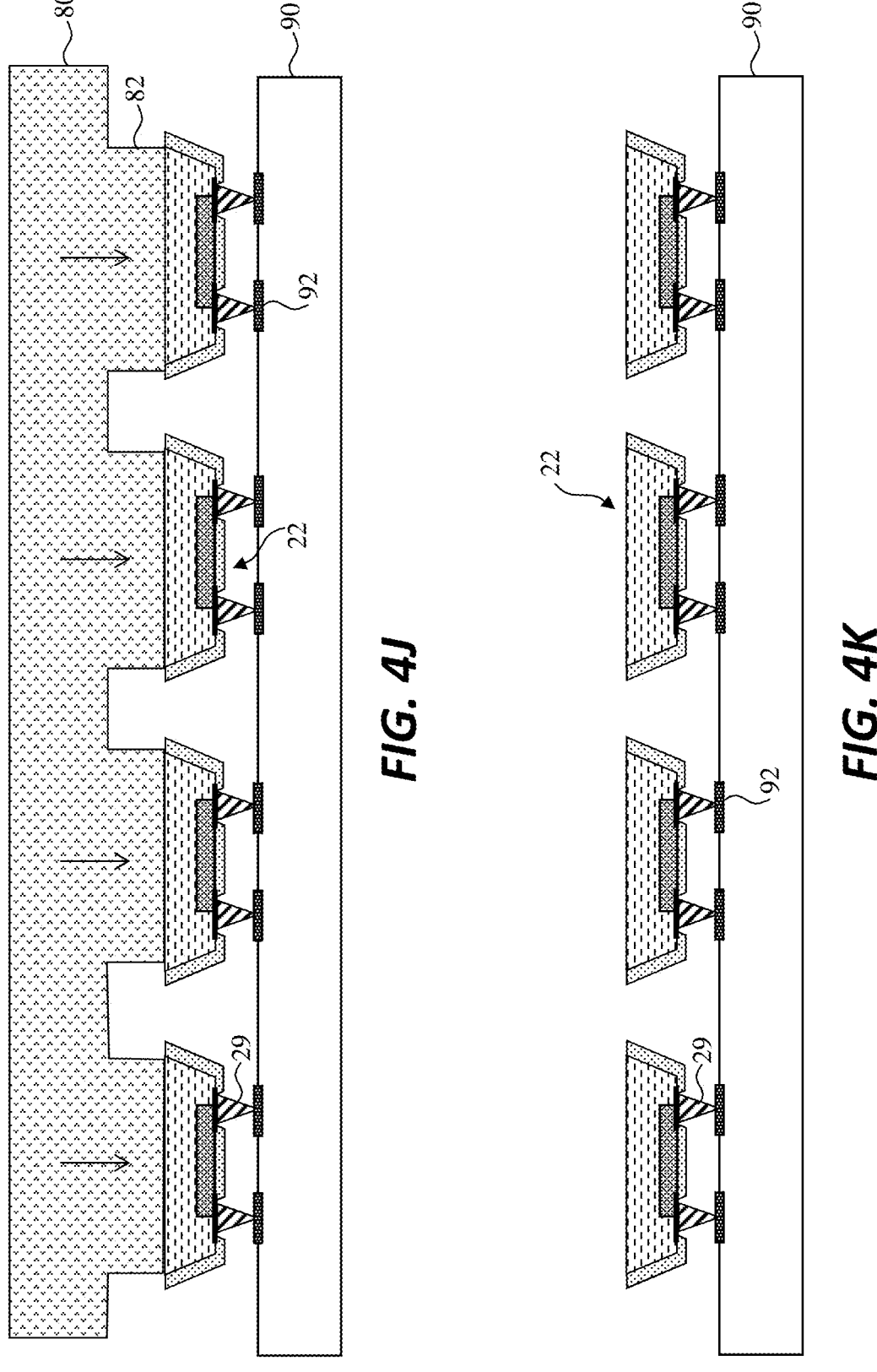
Figure 5:
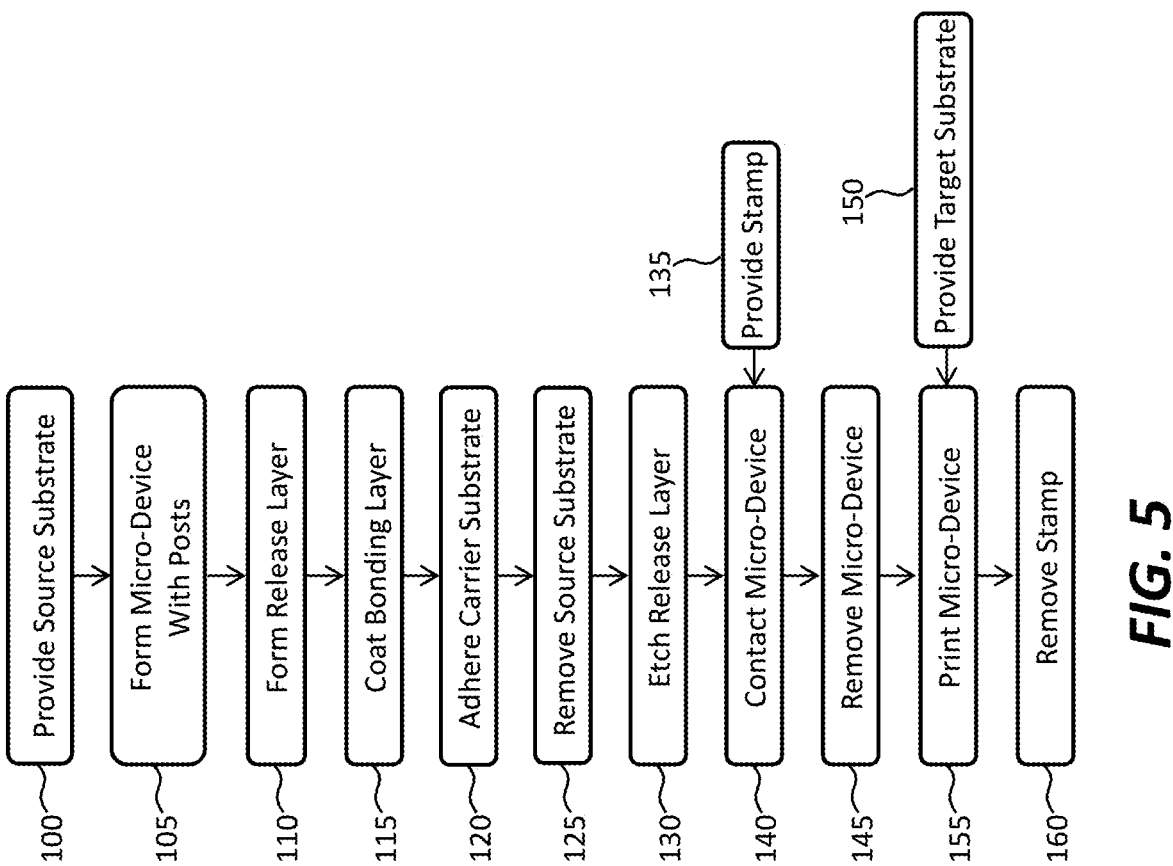
FIG. 5 is a flow diagram illustrating exemplary embodiments of the present disclosure including those described in FIGS. 4A-4K.

FIGS. 4A-4K illustrate successive structures in forming micro-device substrate structure 99 in methods illustrated in the FIG. 5 flow diagram. In an exemplary method according to some embodiments of the present disclosure, a source substrate 10 is provided and a semiconductor layer 20 is disposed on source substrate 10 in step 100 and as shown in FIG. 4A. As shown in FIG. 4B, semiconductor layer 20 is processed in step 105 to form a micro-device 22 comprising a micro-device body 22B and posts 29. Posts 29 can extend from micro-device body 22B on a side of micro-device body 22B opposite source substrate 10 and in a direction away from source substrate 10. A source substrate 10 can be a native substrate for a semiconductor layer 20 or micro-device 22. In some embodiments, a micro-device 22 is not a semiconductor structure.

Step 105 processing can include, for example, any one or more of: adding other material, patterning material, doping, etching, forming structure(s), and other photolithographic or integrated-circuit process(es). Micro-device 22 can include a micro-device circuit 18, an electrical contact 25 for providing electrical power to micro-device circuit 18, and a patterned dielectric layer 24 to encapsulate and insulate portions of micro-device 22.

In various embodiments, a source substrate 10 can be glass, plastic, semiconductor, silicon, compound semiconductor, sapphire (e.g., aluminum oxide or $Al_2O_3$), ceramic, quartz, silicon, GaAs, GaN, InP, SiC, GaP, GaSb, AlN, MgO, or other substrates suitable for photolithographic processing. A source substrate 10 can be substantially transparent, for example at least 50%, 70%, or 90% transparent to visible, UV, or IR electromagnetic radiation, or to laser radiation. A source substrate 10 can include multiple layers, can include one or more semiconductor layers 20, can be a growth substrate, or can include a growth or semiconductor seed layer on which one or more semiconductor layers 20 can be formed or disposed. A source substrate 10 can be crystalline or have a crystalline layer. A source substrate 10 and semiconductor layer 20 can be a single unified structure with defined layers or comprise multiple layers of one or more different materials.

One or more semiconductor layers 20 can be organic or inorganic, can be crystalline or polycrystalline, can be a semiconductor, can be a compound semiconductor, or can be doped or implanted, for example with p or n doping to provide desired electrical structures and functions, or can include one or more of GaN, Si, InP, SiGe, and GaAs. One or more semiconductor layers 20 can be formed or disposed in step 100 using photolithographic processes including, for example, evaporation or sputtering, or formed or disposed using one of various methods of chemical vapor deposition. In some embodiments, a source substrate 10 is a semiconductor substrate and disposing one or more semiconductor layers 20 in, on, or over source substrate 10 includes doping or implanting a portion or layer of the semiconductor substrate (source substrate 10) to form the one or more semiconductor layers 20. In some embodiments, disposing the one or more semiconductor layers 20 in, on, or over source substrate 10 includes growing one or more semiconductor layers 20 on source substrate 10 or on a growth layer on source substrate 10, for example using epitaxial techniques. In some such embodiments, source substrate 10 can be a crystalline semiconductor substrate or sapphire substrate.

The one or more semiconductor layers 20 can be processed in step 105 using photolithographic methods, for example including one or more of evaporation, sputtering, chemical vapor deposition (CVD), physical vapor deposition (PVD), annealing, or masking using photoresist, exposure to patterned radiation, and etching. Semiconductor layers 20 can be patterned and structured and additional layers and structures can be formed on or in the one or more semiconductor layers 20, for example patterned dielectric layers 24 or patterned conductors such as electrical contacts 25 formed, as shown in FIG. 4B. Electrical contacts 25 can be a metalized portion of one or more of semiconductor layers 20 or a patterned metal layer over one or more of semiconductor layers 20 (e.g., with Ag, Al, Ni, Ti, Au, Pd, W, or metal alloys) or simply a designated portion of one or more of semiconductor layers 20. Electrical contact 25 can be portions of a semiconductor micro-device 22 to which electrical connections can be made and power and signals provided to operate micro-device 22. Semiconductor layers 20 and any additional layers and structures necessary to function can form semiconductor micro-device 22. A plurality of semiconductor micro-devices 22 can be disposed on a source substrate 10, as shown in FIG. 4B.

A semiconductor micro-device 22 can include all of the elements necessary to function but does not necessarily include electrical connections to external power or signal sources that enable device operation, or necessarily include protective layers. FIG. 4B illustrates a micro-device 22 structure with shaped, structured, doped, and optionally implanted semiconductor layers 20, a patterned dielectric layer 24 that defines vias, and two electrical contacts 25 through which electrical power can be transmitted to semiconductor layers 20 to cause semiconductor micro-device 22 to operate. In certain embodiments, a semiconductor micro-device 22 is formed by photolithographic steps, such as processing and patterning steps, to render semiconductor micro-device 22 functional. The functional semiconductor micro-device 22 in FIG. 4B can be an integrated circuit and can be a device that provides a desired electronic, optical, thermal, mechanical, magnetic, electric field, photonic, or opto-electronic effect or circuit operation when provided with power but does not necessarily include the interconnections necessary to provide power or control signals, such as electrical power or control signals. In certain embodiments, a semiconductor micro-device 22 is an integrated circuit and can be a device that provides a desired electronic, optical, thermal, mechanical, magnetic, electric field, photonic, or opto-electronic effect or circuit operation when provided with power but does not necessarily include the interconnections necessary to provide power or control signals, such as electrical power or control signals. In some embodiments, micro-device 22 is not a semiconductor device.

In step 110 and as shown in FIG. 4C, a release layer 30 is disposed over, on, and in contact with micro-device 22 and in contact with source substrate 10 (or layers formed on source substrate 10), for example by coating, evaporation, sputtering, or vapor deposition. A release layer 30 can be blanket coated (unpatterned) or patterned and can be a sacrificial layer and include a material that is differentially etchable from portions of micro-device 22 with which release layer 30 is in contact. In some embodiments, release layer 30 completely covers the exposed portions of micro-device 22 (e.g., the portions of micro-device 22 not in direct contact with source substrate 10). A release layer 30 can be formed or disposed using photolithographic methods and materials and can include germanium, Si, TiW, Al, Ti, a lift-off resist, or other polymers. In some embodiments, a release layer 30 material can etch in developer. In some embodiments, a release layer 30 is not photo-active. In some embodiments, a release layer 30 can etch at a higher temperature than photo-active materials such as photo-resists (e.g., greater than 200° C., 300° C., or 400° ° C.).

As shown in FIG. 4D, in step 115 a conformable and curable bonding layer 40 is disposed over release layer 30 and is not in direct contact with micro-device 22. Bonding layer 40 can cover and conform to micro-device 22 and release layer 30 on a conformal side of bonding layer 40 and can have a planar side on a side of bonding layer 40 opposite release layer 30. Bonding layer 40 can be, for example, an adhesive, a curable resin, epoxy, SU-8, a metal layer, a metal alloy layer, a solder layer, or AuSn. Micro-device 22, posts 29, and release layer 30 shown in FIG. 4D therefore form an indentation 16 or depression in bonding layer 40 that is cavity 12 or a pocket in bonding layer 40. Cavity 12 can be formed in any layer, such as, for example, support substrate 50 or a layer of support substrate 50 such as bonding layer 40. One or more layers can be disposed in cavity 12. Because release layer 30 is disposed completely over micro-device 22, cavity 12 has an area over source substrate 10 greater than a micro-device 22 surface area over source substrate 10 (e.g., wherein the area of cavity 12 is defined by the area of micro-device 22 and the area of the corresponding release layer 30 projected onto source substrate 10) and a volume greater than a volume of micro-device 22. In certain embodiments, because release layer 30 can completely cover micro-device 22, no portion of bonding layer 40 is in direct contact with micro-device 22. Depending on, for example, the patterning of release layer 30, a bonding layer 40 can, but does not necessarily, directly contact a source substrate 10.

As illustrated in FIG. 4E, in step 120 a carrier substrate 52 is provided and adhered to the planar side of bonding layer 40 opposite release layer 30. Carrier substrate 52 and bonding layer 40 can together form support substrate 50 or, in some embodiments, bonding layer 40 alone forms support substrate 50. In some embodiments, bonding layer 40 is coated on release layer 30 (as shown in FIG. 4D) and carrier substrate 52 is adhered to bonding layer 40. In some embodiments, a bonding layer 40 is coated on carrier substrate 52 and then release layer 30 is adhered to bonding layer 40 (not shown) with a micro-device 22 and source substrate 10. In either of these cases, cavity 12 is formed in bonding layer 40 in which a micro-device 22 is disposed with release layer 30 between micro-device 22 and support substrate 50 and, moreover, no portion of support substrate 50 is in contact with micro-device 22. Nor is there any physical structure (except for release layer 30) connecting micro-device 22 to bonding layer 40, carrier substrate 52, or support substrate 50.

Carrier substrate 52 (or support substrate 50) can be substantially transparent, for example at least 50%, 70%, or 90% transparent to visible, UV, or IR electromagnetic radiation, or to laser radiation. Carrier substrate 52 can be disposed in contact with bonding layer 40 and bonding layer 40 can be bonded to carrier substrate 52 and release layer 30 and micro-devices 22, for example, by curing bonding layer 40 by heating, by cooling, or by providing electromagnetic radiation to bonding layer 40, for example through carrier substrate 52, or otherwise solidifying bonding layer 40. Curing bonding layer 40 can include forming a chemical reaction in a material of bonding layer 40 or hardening bonding layer 40, or by facilitating a phase change from a liquid to a solid (as with a solder). Bonding layer 40 can be cured by exposing bonding layer 40 material to light or heat (for example if bonding layer 40 is a UV-curable resin) or by exposing bonding layer 40 to heat to melt a metal or metal alloy, disposing a structure in contact with the melted metal or metal alloy, and then cooling the metal. Thus, in some embodiments of the present disclosure, a metal or metal alloy bonding layer 40 is deposited, heated to melt metal bonding layer 40 to a liquid, a carrier substrate 52 or release layer 30 is brought into contact with the melted liquid metal bonding layer 40, and the melted metal bonding layer 40 is cooled to a solid to adhere bonding layer 40 to carrier substrate 52 or release layer 30.

In step 125 and as shown in FIG. 4F, source substrate 10 is removed, for example, by one or more of laser liftoff, ablation, laser ablation, etching, and grinding. In some embodiments, both grinding and another removal technique, such as etching, are used. For example, source substrate 10 can be transparent to laser light and a laser can heat a layer of source substrate 10 (e.g., an ablation layer), a layer of semiconductor layer 20, a layer of a portion of bonding layer 40, a layer of a portion of release layer 30, or a layer of a portion of micro-device 22 in contact with source substrate 10 and ablate the heated material to separate micro-device 22 and release layer 30 (and optionally any bonding layer 40 in contact with source substrate 10) from source substrate 10. The removal of source substrate 10 exposes at least a portion of release layer 30.

Next and as shown in FIG. 4G, in step 130 the structure can be inverted (as shown compared to FIG. 4F) and release layer 30 can be etched to remove the sacrificial material in release layer 30, for example by etching with $H_2O_2$, $XeF_2$, HCl, HF, trimethylammonium hydroxide (TMAH), or oxygen plasma. The selection of etchant can depend on the material of patterned or unpatterned release (sacrificial) layer 30. For example, $H_2O_2$ or $XeF_2$ can be used with a Ge, W, or TiW release layer 30, $XeF_2$ can be used with a Si release layer 30, HCl acid mixtures can be used with an Al or Ti release layer 30, TMAH-based developers can be used with a lift-off resist release layer 30, and oxygen plasma can be used with polyimide, epoxy, poly(methyl methacrylate) (PMMA), or other organic release layers 30. An etchant can be benign to materials found in or exposed on the surface of micro-device 22 (e.g., is differentially etchable with respect to materials in micro-device 22). In certain embodiments, after etching, release layer 30 defines a gap 32 (e.g., a space) between portions of micro-devices 22 and bonding layer 40. Micro-devices 22 can be physically completely separated from bonding layer 40 and support substrate 50, for example is not physically connected or chemically adhered to bonding layer 40 and support substrate 50.

As shown in FIG. 4G, because micro-device 22 is completely separated from bonding layer 40 and support substrate 50 by release layer 30 (steps 110 and 115, FIGS. 4C and 4D), micro-device 22 is completely detached and separated from support substrate 50 and bonding layer 40. In embodiments, there is no tether or other structural component that connects micro-device 22 to support substrate 50. Micro-device 22 can fall into and touch cavity 12 (e.g., be in physical contact with cavity 12), as shown, but micro-device 22 is not structurally connected (e.g., with a tether) or attached (e.g., chemically bonded) to cavity 12, for example to cavity bottom 14 or a surface of indentations 16. Because cavity 12 is larger than micro-device 22, micro-device 22 could move within cavity 12, but the range of movement is limited by posts 29 in indentations 16 of cavity 12. Micro-devices 22 can be in physical contact with bonding layer 40 or support substrate 50 after etching is complete, for example by falling into indentation 16 or cavity 12 or by mechanical vibration or movement, but actual physical or mechanical movement of micro-devices 22 is constrained by posts 29 in indentations 16. Thus, the physical location of micro-devices 22 with respect to bonding layer 40 and support substrate 50 is substantially the same after etching release layer 30 as before etching release layer 30. Release layer 30 can be relatively thin with respect to the area of micro-device 22 over bonding layer 40 and support substrate 50, for example a few microns. In some embodiments, release layer 30 has a thickness of no more than 20 microns, no more than 10 microns, no more than 8 microns, no more than 6 microns, no more than 5 microns, or no more than 4 microns.

As shown in FIG. 4H, an elastomeric stamp 80 with stamp posts 82 having distal surfaces that are conformable and compliant and can align with and then deform, compress, press against, and adhere to micro-devices 22 is provided in step 135 and contacted to micro-devices 22 in step 140. An orientation of micro-device 22 within cavity 12 is constrained by posts 29 in indentations 16, facilitating micro-device 22 pick-up with desired positional accuracy. In step 145 and as shown in FIG. 4I, micro-devices 22 are removed from support substrate 50. As shown in FIG. 4J, a target substrate 90 (e.g., a destination substrate 90) is provided in step 150 and, in step 155, micro-devices 22 are brought into aligned contact with target substrate 90, thus micro-transfer printing micro-devices 22 from support substrate 50 to target substrate 90. In step 160 and as shown in FIG. 4K, stamp 80 is removed. In some embodiments, electrical contacts 25 of micro-device 22 are electrically connected to contact pads 92 formed or disposed on target substrate 90. A target substrate 90 can have a non-planar surface with a topography that complements a non-planar semiconductor structure surface of a micro-device 22. Contact pads 92 of a target substrate 90 can be electrically connected to an electrical circuit, for example through electrical conductors on target substrate 90 (not shown), to provide electrical power and signals to micro-device 22.

Indentations 16 can constrain movement of untethered and detached micro-devices 22 with respect to support substrate 50 after release layer 30 is etched. In some embodiments and in order to effectively micro-transfer print micro-devices 22 from indentations 16, stamp posts 82 must have an extent large enough to successfully contact and adhere to the exposed surface of micro-devices 22 despite any variation in the location of micro-devices 22 in indentations 16. Furthermore, the variation in position of micro-devices 22 in indentations 16 can be complemented by the size of contact pads 92 on a target substrate 90. The difference in size between posts 29 and indentations 16 can be used to determine (e.g., correspond to) a size of contact pads 92 on a target substrate 90. In some embodiments, stamp posts 82 must also be small enough to fit inside cavity 12 (e.g., when micro-device 22 is disposed entirely within cavity 12). In some embodiments, a stamp post 82 has an area and dimensional extent smaller than the corresponding area and dimensional extent of cavity 12 in support substrate 50 so that stamp post 82 can extend into cavity 12 to contact micro-device 22. In some embodiments, stamp post 82 has an area greater than an area of a contact surface of a micro-device 22 surface (e.g., a surface opposite a release layer 30), for example if micro-device 22 protrudes from cavity 12, and a stamp post 82 with an area larger than the surface area of cavity 12 can be used.

FIGS. 4A-5 illustrate embodiments of the present disclosure using a carrier substrate 52 and bonding layer 40 forming support substrate 50 in a flip-chip structure and method in which micro-devices 22 are non-native to support substrate 50. In some embodiments and as illustrated in the successive structures of FIGS. 6A-6I and FIG. 7 flow diagram, source substrate 10 is support substrate 50 and micro-devices 22 are native to support substrate 50.

Figures 6A, 6B:
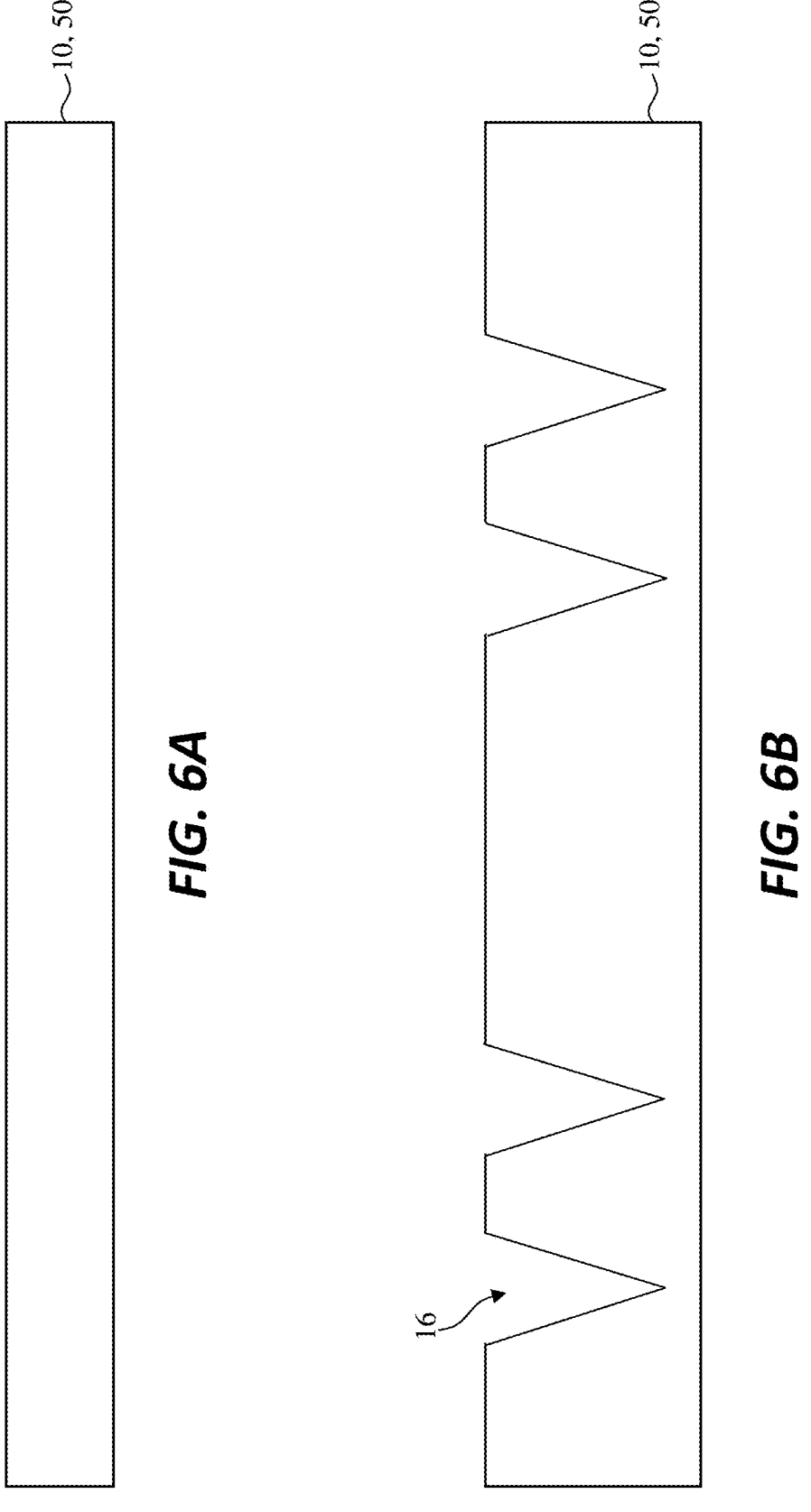
FIGS. 6A-6I are successive cross sections illustrating sequential steps in exemplary methods according to some embodiments of the present disclosure and illustrating micro-device substrate structures according to illustrative embodiments of the present disclosure.
Figures 6C, 6D:
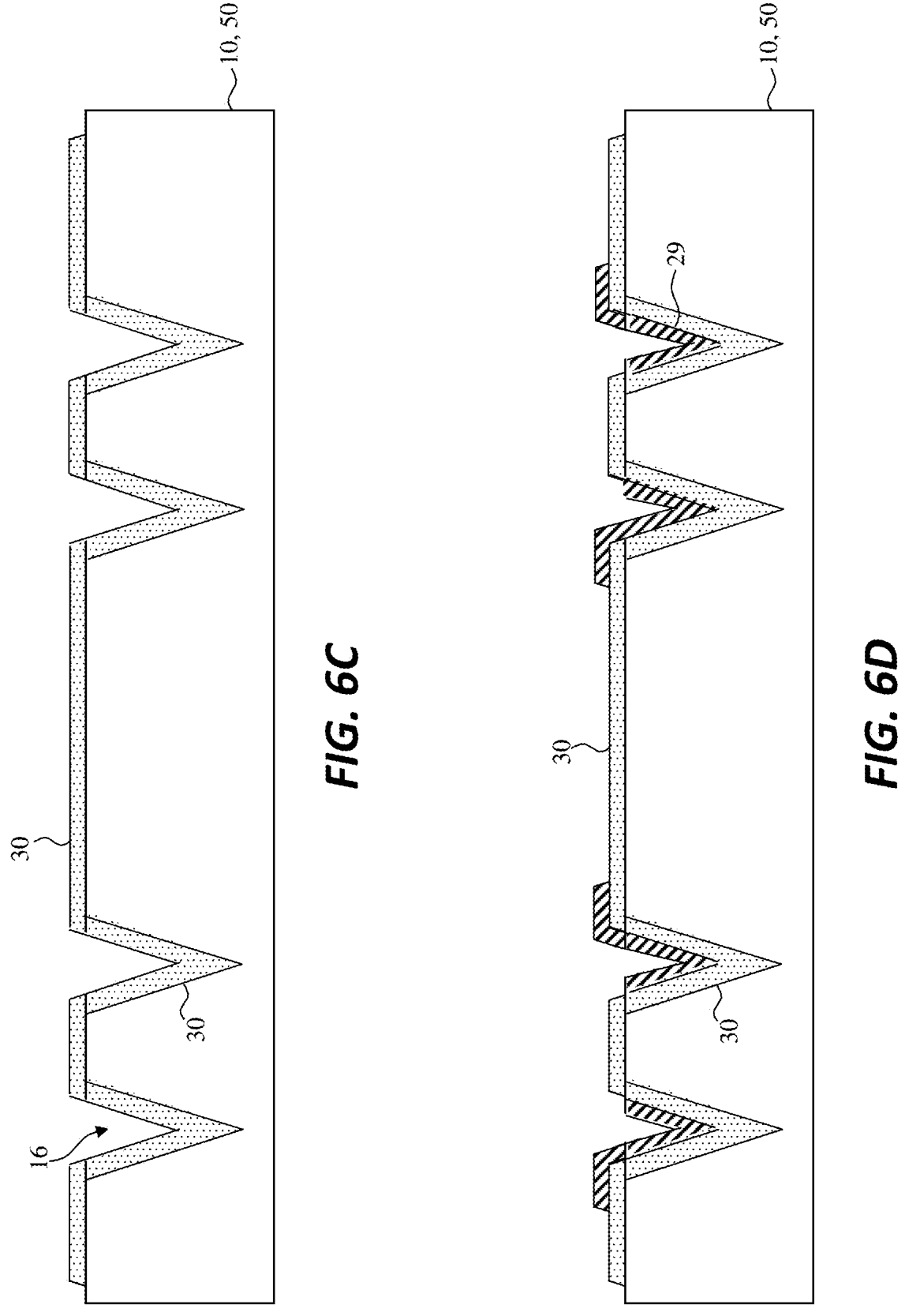
Figures 6E, 6F:
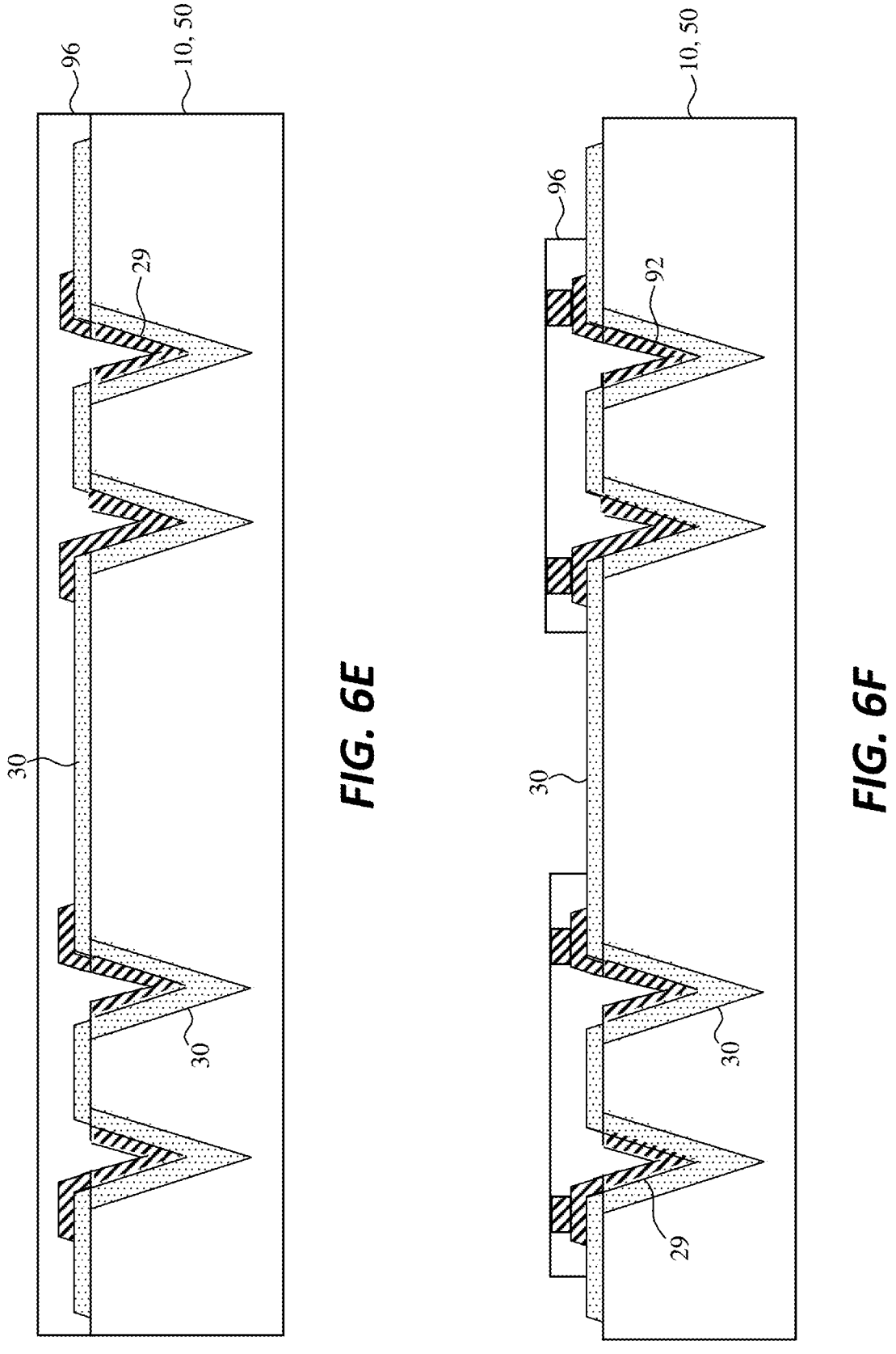
Figures 6G, 6H:
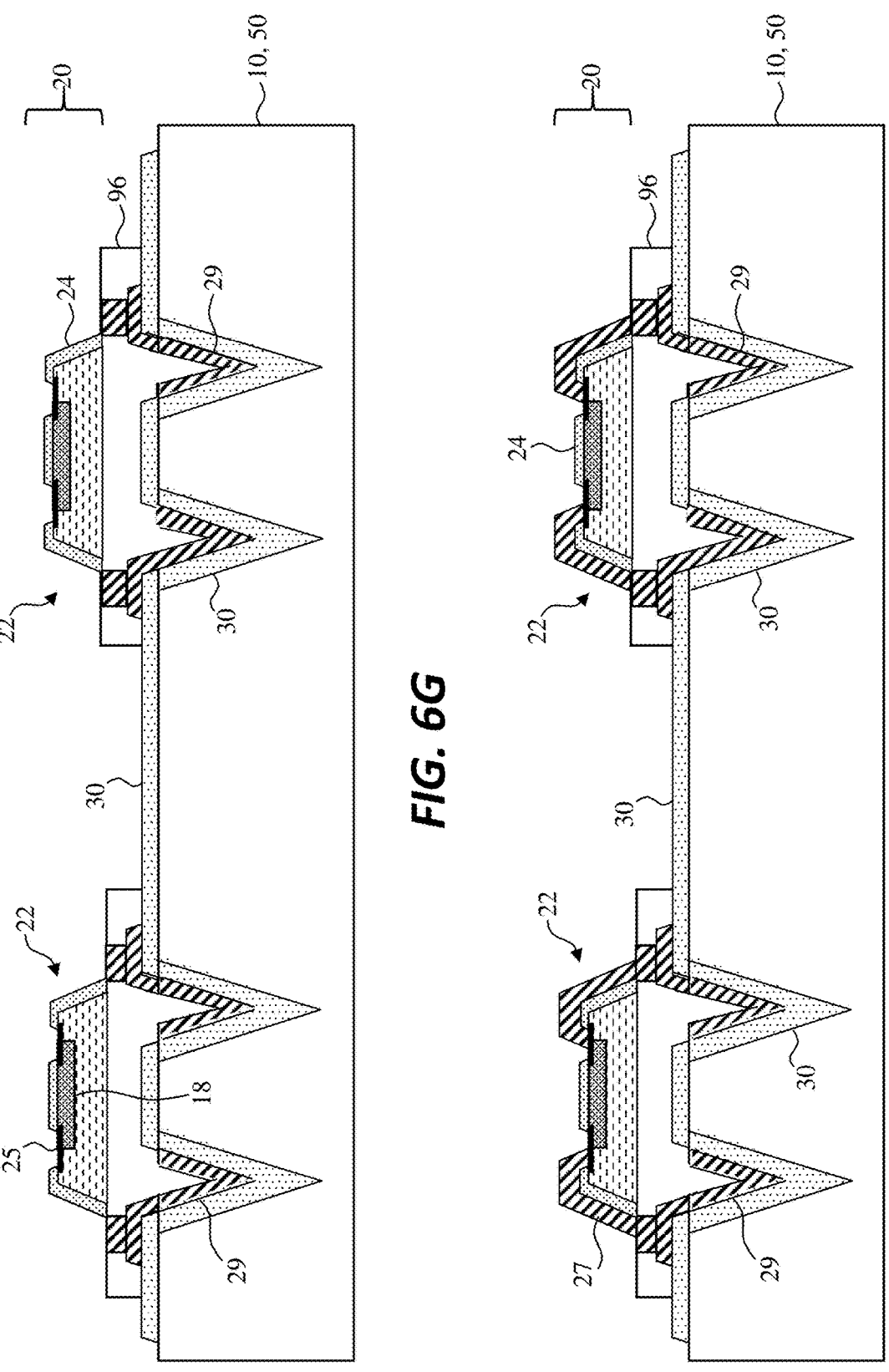

As shown in FIG. 6A, a source substrate 10 is provided in step 200 and as shown in FIG. 6B, indentations 16 are formed in source substrate 10 in step 205. As shown in FIG. 6C, in step 210 release layer 30 is disposed over source substrate 10 and in indentations 16. At least a layer of posts 29 can be disposed over release layer 30 in indentations 16 in step 215 as shown in FIG. 6D and a dielectric layer 96 can be disposed over the post 29 layer, forming post 29 and a layer of micro-device body 22B as shown in FIG. 6E. Dielectric layer 96 can be patterned to form portions corresponding to each micro-device 22 and vias that can be filled with conductive material, as shown in FIG. 6F. As shown in FIG. 6G, in step 220 micro-device 22 can be formed in an epitaxial layer disposed on dielectric layer 96 or micro-transfer printed to dielectric layer 96 and, as shown in FIG. 6H, electrically connected to posts 29 through the vias with patterned electrodes 27 connected to electrical contacts 25. In some embodiments, the vias can be filled in a common step with forming electrodes 27.

Figure 6I:
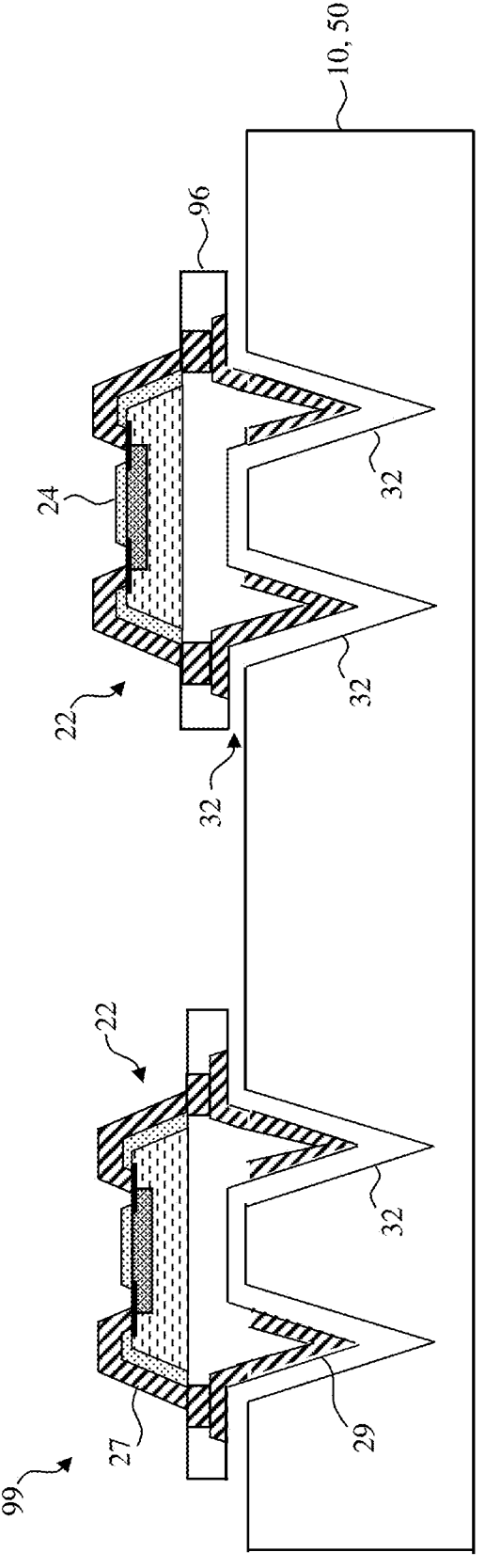
Figure 7:
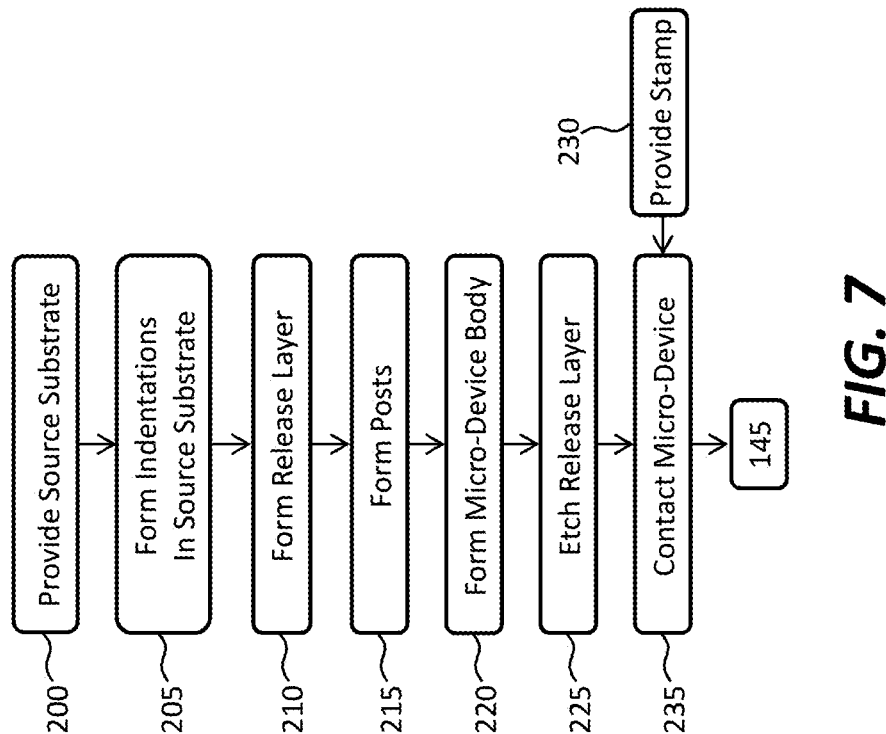
FIG. 7 is a flow diagram illustrating exemplary embodiments of the present disclosure including those described in FIGS. 6A-6I.

In some embodiments, semiconductor layer(s) 20 are formed in or on a source substrate 10, for example by doping or implanting source substrate 10 form an epitaxial layer on or in the top of source substrate 10. Semiconductor layer(s) 20 can be processed in step 220 to form micro-devices 22. Thus, forming semiconductor layer(s) 20 in step 220 can include forming a layer on source substrate 10 or forming a layer in source substrate 10. In step 225 and as shown in FIG. 6I, release layer 30 is etched to remove release layer 30 and form a gap 32 between micro-devices 22 (including posts 29 and micro-device body 22B) and support substrate 50. Micro-device 22 can then be micro-transfer printed with a stamp provided in step 230 and contacted to micro-device 22 in step 235 as described with respect to steps 145 to 160 and in FIGS. 4H-4K.

A source substrate 10 can be one or more of sapphire, quartz, silicon, GaAs, GaN, InP, SiC, GaP, GaSb, AlN, and MgO. A source substrate 10 can be a growth substrate, can have a semiconductor seed layer, or can be a semiconductor layer 20. Source substrate 10 and layers disposed on source substrate 10 can be a support substrate 50. In some embodiments, layers disposed on source substrate 10 can be a support substrate 50. Indentations 16 can be formed by pattern-wise etching source substrate 10, for example using photolithographic patterning and etching methods. In some embodiments, source substrate 10 is a crystalline substrate (such as a semiconductor) that etches with respect to crystal planes to form indentations 16, for example pyramidal indentations 16. In some embodiments in which micro-devices 22 are transfer printed onto support substrate 50 (and are therefore non-native to support substrate 50), source substrate (wafer) 10 can be any suitable substrate, including glass or a substrate with layers disposed thereon. The surface of support substrate 50 can be etched to form indentations 16. In some embodiments, a layer, for example a polymer layer, is coated over a support substrate 50 and forms a layer of support substrate 50. In some such embodiments, a layer can be a part of a support substrate 50. Indentations 16 can be micro-imprinted in the layer and then the layer can be cured.

Release layer 30 can be disposed over source substrate 10 and in indentations 16 by sputtering, evaporation, or coating, such as spray coating and can be a material that is differentially etchable with respect to source substrate 10, such as an inorganic material, for example silicon dioxide, or an organic material, for example a resin, epoxy, or photoresist. Release layer 30 can be a patterned or unpatterned release layer 30 and can completely coat source substrate 10 and indentations 16. A patterned or unpatterned release layer 30 can include germanium, Si, TiW, Al, Ti, a lift-off resist, or other polymers and, when etched, can be a gap 32 or space.

A layer of posts 29 can be a metal layer deposited, for example by evaporation or sputtering, that is likewise differentially etchable with respect to release layer 30. Dielectric layer 96 can be an inorganic material such as silicon dioxide or an organic material such as polyimide. In some embodiments, micro-device 22 can be transfer printed onto dielectric layer 96. In some embodiments, an epitaxial layer can be disposed over dielectric layer 96 and patterned, for example using silicon-on-insulator methods and photolithographic methods and materials. Micro-device 22 can include one or more of a semiconductor material, a compound semiconductor material, GaN, Si, InP, SiGe, and GaAs. Vias, electrical contacts 25, and electrodes 27 can be formed using photolithographic methods and materials. Micro-device 22 can be encapsulated with a protective layer that is differentially etchable with respect to release layer 30 to protect micro-device 22 from the etchant as the etchant etches release layer 30. For example, a certain etchant that is suitable for etching a release layer 30 might also undesirably etch micro-device 22, bonding layer 40, or carrier substrate

52, compromising a micro-transfer printing process for micro-device 22 without the presence of a protective encapsulating layer.

As used herein, an area of cavity 12 (e.g., over a substrate such as a source substrate 10 or support substrate 50) is the maximal planar area covered by micro-device 22 and corresponding portions of release layer 30 in a plane parallel to a surface of micro-device 22 (e.g., projected onto the substrate). An area of a cavity 12 does not include area attributable to a layer in cavity 12 other than release layer 30 and micro-device 22. As used herein, a micro-device 22 area is the maximal planar area covered by micro-device 22 exclusively in the plane that cavity 12 area is measured. In general, a plane used to calculate cavity 12 area and corresponding micro-device 22 area is a plane of a substrate (e.g., a source substrate 10 or support substrate 50) and, therefore, the respective maximal areas are the respective projected areas over the substrate. For example, in certain embodiments, micro-devices 22 are disposed in an array on (e.g., over) a substrate and release layer 30 is a continuous layer of material that is between each of micro-devices 22 and the substrate, such that the corresponding portion of the release layer 30 used in calculating a cavity 12 area is an area of release layer 30 defined by a unit cell of the array. In some embodiments, release layer 30 is patterned such that a material of release layer 30 is not continuous and a cavity 12 area is the maximal planar area corresponding to a corresponding micro-device 22 and a continuous portion of material of patterned release layer 30 adjacent to (e.g., disposed in contact with) the corresponding micro-device 22. The terms "area of a micro-device" and "micro-device area" are used interchangeably herein, as are the terms "area of a cavity" and "cavity area". In some embodiments, cavity area of cavity 12 is greater than micro-device area of micro-device 22.

As used herein, a volume of cavity 12 is the volume of micro-device 22 and volume of a corresponding portion of release layer 30 taken together, where the corresponding portion of release layer 30 is defined as it is for calculation of cavity 12 area. The volume of micro-device 22 is the amount of space occupied by micro-device 22. The terms "volume of a micro-device" and "micro-device volume" are used interchangeably herein, as are the terms "volume of a cavity" and "cavity volume". A volume of a cavity 12 does not include volume attributable to any layer that may disposed in cavity 12 other than release layer 30 and micro-device 22.

In some embodiments, cavity 12 has an area (e.g., over a source substrate 10 or support substrate 50) that is less than or equal to 200%, less than or equal to 150%, less than or equal to 120%, or less than or equal to 110% of the area of micro-device 22. In some embodiments, cavity 12 has a volume that is less than or equal to 200%, less than or equal to 150%, less than or equal to 120%, or less than or equal to 110% of the volume of micro-device 22. In some embodiments, cavity 12 has a volume greater than the volume of micro-device 22 and micro-device 22 is completely within cavity 12. In some embodiments, micro-device 22 has a surface that is aligned or parallel or at least partially in a plane with an exposed portion of a bonding layer 40 opposite a carrier substrate 52 (comprising a support substrate 50). For example, micro-device 22 can have a surface coincident with the top of a carrier substrate 52 or support substrate 50. In some embodiments, micro-device 22 protrudes from a cavity 12. A support substrate 50 can be oriented so that a micro-device 22 falls into cavity 12 due to the force of gravity, mechanical vibration, or mechanical movement.

Micro-device 22 can also adhere to the sides or bottom of a cavity 12 or a side or edge of indentations 16 (e.g., in bonding layer 40 or support substrate 50) by molecular forces, such as van der Waal's forces.

In some embodiments, the absence of a tether or corresponding anchor area reduces the area over a source substrate 10 or support substrate 50 required to form patterned (e.g., completed and functional) micro-devices 22, enabling, for example, one or more of (i) a denser arrangement of micro-devices 22 arranged closer together over a source substrate 10 or support substrate 50, (ii) a reduction in the materials cost of the micro-devices 22 and (iii) a reduction in the number of source substrates 10 or support substrates 50. In some embodiments in which a release layer 30 is unpatterned, an even more dense arrangement is possible, further reducing costs, for example as shown in FIGS. 4F and 6G.

In some embodiments and as illustrated in FIG. 4B, posts 29 are formed on an exposed surface of micro-device body 22B. Such posts 29 can be formed by repeated masking and deposition processes that build up three-dimensional structures. In some embodiments, posts 29 are made of one or more high elastic modulus metals, such as tungsten. As used herein, a high elastic modulus is an elastic modulus sufficient to maintain the function and structure of post 29 when pressed into a target substrate 90 contact pad 92. Posts 29 can be made by etching one or more layers of electrically conductive metal or metal oxide evaporated or sputtered on a side of semiconductor layers 20 opposite source substrate 10. Posts 29 can have a variety of aspect ratios and typically have a peak area smaller than a base area. Posts 29 can have a sharp point that is capable of embedding in or piercing target substrate 90 contact pads 92. Semiconductor devices with protruding connection posts 29 generally are discussed in U.S. Pat. No. 8,889,485 and U.S. Patent Publication No. 2021/0343903, whose descriptions of connection posts is incorporated by reference herein.

In some embodiments of the present disclosure, posts 29 are made with overlapping structures formed on underlying layers. In an exemplary method a substrate 10 is provided and a first layer patterned on a side of source substrate 10, for example a patterned dielectric layer 24. A second patterned layer, for example an electrical contact 25, is patterned over the side of source substrate 10 and only partially overlaps patterned dielectric layer 24. The overlapping portion of electrical contact 25 forms a post 29. Note that, in general, post 29 could form a point or be a ridge, a rectangle, a ring, or other non-point shape. The process can be repeated to form a second post 29 using third and fourth layers or the same steps can be used to construct multiple connection posts 29 by forming multiple overlapping portions of the first and second layers.

In some embodiments, connection posts 29 are formed by physical vapor deposition through a template mask. A substrate (e.g., source substrate 10) has an electrical connection (e.g., electrical contact 25) on a substrate surface (e.g., support-substrate surface 54) and a template mask structure, for example a pair of polymer re-entrant structures, formed on either side of the electrical connection. A suitable material, such as a metal for example, aluminum, gold, silver, titanium, tin, tungsten, or combinations of metals is physically evaporated over the substrate electrical connection and the template mask. As physical vapor deposition proceeds, a post 29 is formed as material condenses and deposits on the electrical connection. Material also deposits on the template mask structure, narrowing the opening between the template masks, and thus also narrowing the top of post 29 to form a spike. Once post 29 is completed, the template mask is removed, for example by laser lift-off or other photolithographic methods. The area of material deposition can be controlled using conventional patterning methods, for example including photoresist deposition, patterning, and stripping.

Figure 8B:
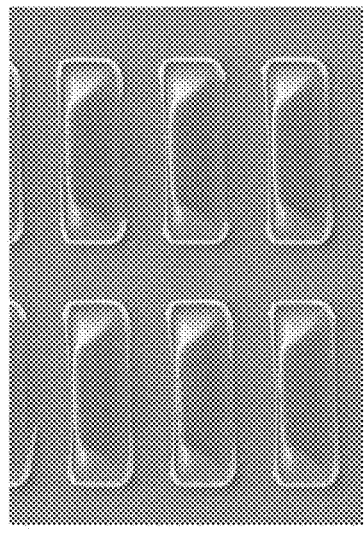
FIGS. 8A-8D are micrographs of posts according to illustrative embodiments of the present disclosure.
Figure 8D:
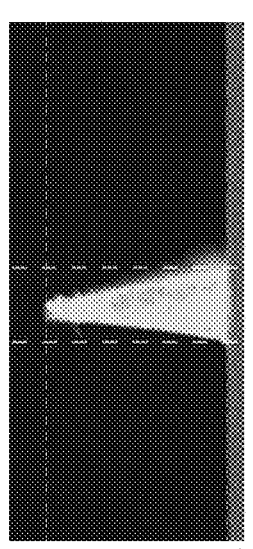
Figure 8A:
Figure 8C:
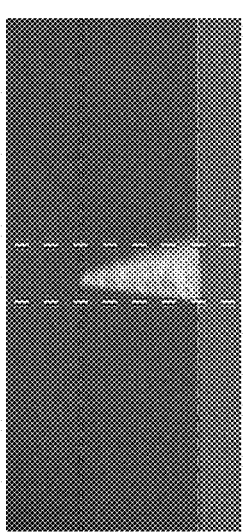

Connection posts 29 constructed using physical vapor deposition are shown in FIGS. 8A-8D. FIGS. 8A and 8B are micrographs of circular and linear posts 29, respectively. FIGS. 8C and 8D are cross sections of posts 29, showing a sharp spike with a base diameter of 2.7 μm and a height of 6.4 μm, as indicated with the dashed lines. In certain embodiments, posts 29 have a height that is greater than or equal to 2, 4, 10, 20, 50, or 100 times a base dimension (e.g., diameter). Posts 29 can have various shapes, such as radially symmetric, linear (blade-like), pyramidal, or ring-shaped depending on the shape of the template mask.

In some embodiments, posts 29 of a micro-device 22 can have different lengths. In some embodiments, indentations 16 can have different depths. In some embodiments, posts 29 extend from different planes of micro-devices 22. Thus, when micro-transfer printing to a target substrate 90, in some embodiments micro-devices 22 have a surface parallel to a surface of target substrate 90 even if posts 29 extend from different surfaces in different planes of micro-device 22 or in some embodiments micro-devices 22 can be tilted with respect to target substrate 90. This can be useful, for example, when micro-device 22 is an optical device and the orientation of the optical device is important.

Micro-devices 22 can have a variety of different sizes suitable for micro-transfer printing. For example, micro-devices 22 can have at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height (thickness) from 2 to 5 μm, 4 to 10 μm, 10 to 20 μm, or 20 to 50 μm.

Methods of forming micro-transfer printable structures are described, for example, in the paper *AMOLED Displays using Transfer-Printed Integrated Circuits* (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see U.S. Pat. Nos. 8,722,458, 7,622,367 and 8,506,867, of which the disclosure of micro-transfer printing techniques (e.g., methods and structures) in each is hereby incorporated by reference. Micro-transfer printing using compound micro-assembly structures and methods can also be used with certain embodiments of the present disclosure, for example, as described in U.S. patent application Ser. No. 14/822,868, filed Aug. 10, 2015, entitled Compound Micro-Assembly Strategies and Devices, from which the description of compound micro-assembly structures and methods is hereby incorporated by reference. A micro-device 22 can be a compound micro-system or portion thereof (e.g., device thereof). Additional details useful in understanding and performing aspects of some embodiments of the present disclosure are described in U.S. patent application Ser. No. 14/743,981, filed Jun. 18, 2015, entitled Micro Assembled LED Displays and Lighting Elements, which is hereby incorporated by reference in its entirety.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations, a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross-section line
D1 distance
D2 depth
10 source substrate/source wafer
12 cavity
14 cavity bottom
16 indentation
18 circuit
20 semiconductor layer/semiconductor structure
22 micro-device
22B micro-device body
24 dielectric layer
25 electrical contact
27 electrode
29 post/connection post
30 release layer/sacrificial layer
32 gap
40 bonding layer
50 support substrate
52 carrier substrate
54 support-substrate surface
80 stamp
82 stamp post
90 destination substrate/target substrate
92 contact pad
96 dielectric layer
99 micro-transfer-printing source structure
100 provide source substrate step
105 form micro-device with posts step
110 form release layer step
115 coat bonding layer step
120 adhere carrier substrate step
125 remove source substrate step
130 etch release layer step
135 provide stamp step
140 contact micro-device step 145 remove micro-device step
150 provide target substrate step
155 print micro-device step
160 remove stamp step
200 provide source substrate step
205 form indentations in source substrate step
210 form release layer step
215 form posts step
220 form micro-device body step
225 remove release layer step
230 provide stamp step
235 contact micro-device step

What is claimed:

1. A micro-device substrate structure, comprising:
a support substrate having a support-substrate surface;
spatially separated indentations extending into the support substrate; and
a micro-device comprising a micro-device body and micro-device posts, wherein the micro-device posts extend from the micro-device body into the support substrate and each of the micro-device posts is disposed at least partly in a different one of the spatially separated indentations.

2. The micro-device substrate structure of claim 1, wherein the support substrate comprises a cavity extending into the support substrate from the support-substrate surface to a cavity bottom, and wherein the spatially separated indentations are disposed in the cavity bottom and extend into the support substrate from the cavity bottom.

3. The micro-device substrate structure of claim 2, wherein the micro-device is disposed at least partially in the cavity.

4. The micro-device substrate structure of claim 2, wherein the cavity bottom has a bottom planar area over the support substrate that is planar, the spatially separated indentations together have an indentation area over the support substrate, and the indentation area is less than the bottom planar area.

5. The micro-device substrate structure of claim 1, wherein the micro-device posts are not attached to the spatially separated indentations or to the support substrate.

6. The micro-device substrate structure of claim 1, wherein the micro-device posts have a shape geometrically similar to the spatially separated indentations.

7. The micro-device substrate structure of claim 1, wherein the micro-device posts have a shape that is not geometrically similar to the spatially separated indentations.

8. The micro-device substrate structure of claim 1, wherein (i) the micro-device posts extend from the micro-device body a distance greater than a depth of each of the spatially separated indentations, (ii) the micro-device body is spaced apart from the support substrate by a gap, or (iii) both (i) and (ii).

9. The micro-device substrate structure of claim 1, wherein the micro-device posts have a distal end having a distal area smaller than an area of a proximal end, the micro-device posts are sharp, or both.

10. The micro-device substrate structure of claim 1, wherein the micro-device comprises a micro-device circuit, the micro-device posts are electrically conductive, and the micro-device posts are electrically connected to the micro-device circuit.

11. The micro-device substrate structure of claim 1, comprising a release layer disposed between the support substrate and the micro-device.

12. The micro-device substrate structure of claim 11, wherein the release layer is differentially etchable from the micro-device.

13. The micro-device substrate structure of claim 11, wherein the micro-device has one or more sides that are adjacent to the support substrate and the release layer is disposed between all of the one or more sides of the micro-device and the support substrate.

14. The micro-device substrate structure of claim 11, wherein the release layer further surrounds a perimeter of the micro-device.

15. The micro-device substrate structure of claim 11, wherein no portion of the micro-device is in direct contact with the support substrate.

16. The micro-device substrate structure of claim 11, wherein at least a portion of the release layer is exposed to a local environment.

17. The micro-device substrate structure of claim 1, wherein the micro-device comprises three or more posts, the spatially separated indentations comprise three or more indentations, the micro-device posts are arranged in two dimensions, and the spatially separated indentations are arranged in two dimensions.

18. The micro-device substrate structure of claim 1, comprising a carrier substrate and a bonding layer that bonds the micro-device to the carrier substrate, and wherein the support substrate is the bonding layer on the carrier substrate.

19. The micro-device substrate structure of claim 1, wherein the support substrate is a semiconductor wafer.

20. The micro-device substrate structure of claim 1, wherein the micro-device is non-native to the support substrate.

21. The micro-device substrate structure of claim 1, wherein the micro-device is native to the support substrate.

22. The micro-device substrate structure of claim 1, wherein a surface of the micro-device opposite the support substrate is exposed to a local environment.

* * * * *